US006998644B1

(12) United States Patent
Boling et al.

(10) Patent No.: US 6,998,644 B1
(45) Date of Patent: Feb. 14, 2006

(54) DISPLAY DEVICE WITH AN ARRAY OF DISPLAY DRIVERS RECESSED ONTO A SUBSTRATE

(75) Inventors: Edward Boling, Fremont, CA (US); Jeffrey Jay Jacobsen, Hollister, CA (US); Ronald Stephen Nowicki, Sunnyvale, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 711 days.

(21) Appl. No.: 09/932,406

(22) Filed: Aug. 17, 2001

(51) Int. Cl.
*H01L 29/06* (2006.01)

(52) U.S. Cl. .......................... 257/88; 257/207; 345/204
(58) Field of Classification Search ................ 257/72, 257/88, 207, 208, 347; 345/204; 313/582
See application file for complete search history.

(56) References Cited

U.S. PATENT DOCUMENTS

| | | | | |
|---|---|---|---|---|
| 5,554,828 A | * | 9/1996 | Primm | 178/19.06 |
| 5,818,165 A | * | 10/1998 | Malhi | 313/495 |
| 5,821,688 A | * | 10/1998 | Shanks et al. | 313/498 |
| 6,005,345 A | * | 12/1999 | Choi et al. | 313/582 |
| 6,091,381 A | * | 7/2000 | Uenuma | 345/74.1 |
| 6,111,555 A | * | 8/2000 | Haas | 345/60 |
| 6,133,689 A | * | 10/2000 | Watkins et al. | 313/495 |
| 6,590,346 B1 | * | 7/2003 | Hadley et al. | 315/169.3 |

* cited by examiner

*Primary Examiner*—Stephen W. Smoot
(74) *Attorney, Agent, or Firm*—Blakely, Sokoloff, Taylor & Zafman LLP

(57) ABSTRACT

Apparatuses and methods for forming displays are claimed. One embodiment of the invention relates to dispensing display drivers over a substrate. The display drivers, for example, may be a plurality of emitters and gates in order to form a display such as a field emission display (FED). Alternatively, the display drivers may be rods for a plasma display. Another embodiment of the invention relates to forming an electronic device along a length of substrate using template transfer or FSA to deposit display drivers into recessed regions or holes of a substrate. Another embodiment of the invention relates to using FSA and a deterministic method such as "pick and place" to place display drivers onto a substrate. Another embodiment of the invention relates to using donor transfer of display drivers to a substrate.

16 Claims, 33 Drawing Sheets

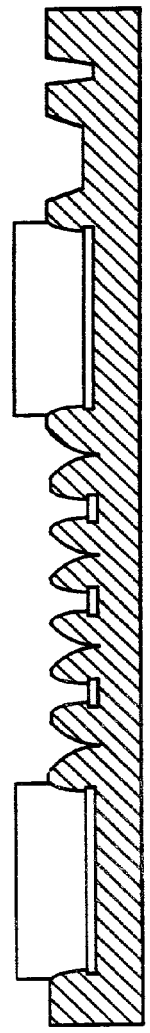
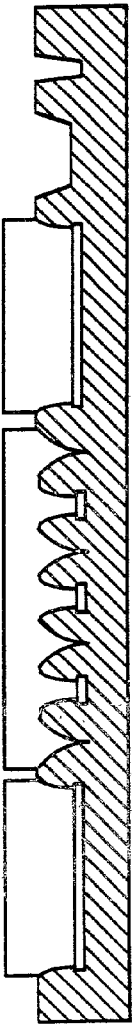
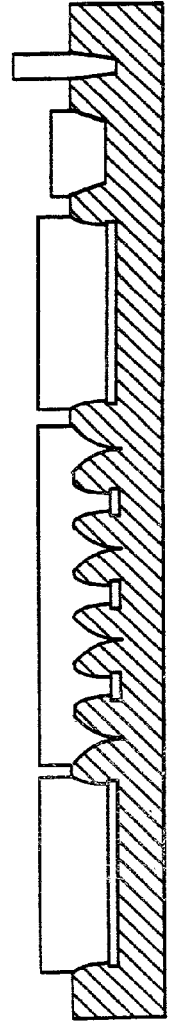
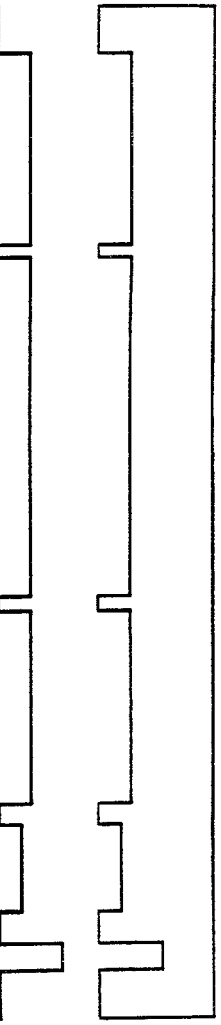
Fig. 14A
Fig. 14B
Fig. 14C
Fig. 14D
Fig. 14E

DISPLAY DEVICE WITH AN ARRAY OF DISPLAY DRIVERS RECESSED ONTO A SUBSTRATE

BACKGROUND INFORMATION

1. Field of the Invention

The present invention relates generally to the manufacturing of electronic assemblies, and more particularly to the manufacture of display devices.

2. Description of Related Art

Electronic assemblies such as display devices are known in the art. Display devices include a variety of displays such as field emission displays (FEDs), plasma display devices, and other suitable display devices. Each of these display devices are described below.

FEDs are generally used for television images, oscilloscope radar displays, computer displays, and other like applications. FIG. 1 illustrates a cross-sectional view of a FED known in the art. FEDs are comprised of anode 2 and cathode 8. Anode 2 comprises multiple layers of material. These multiple layers include a face layer 6, a vacuum layer 18, a conductive layer 20, and a luminescent layer 22. As noted in U.S. Pat. No. 5,818,165, the face layer 6 of the anode 2 may be comprised of flexible material.

Face layer 6 has a top and bottom surface. The bottom surface of face layer 6 is parallel to cathode 8. Face layer 6 must be comprised of material that allows the face layer 6 to have sufficient strength to maintain a vacuum. Vacuum layer 18 is introduced onto the bottom side of face layer 6. Vacuum layer 18 also has a top and bottom side. The top side of vacuum layer 18 is adjacent to face layer 6. Vacuum layer 18 may be comprised of a flexible material such as silicon dioxide ($SiO_2$), silicon nitride ($Si_3N_4$), or silicon carbide (SiC).

Conductive layer 20 is formed onto the bottom surface of the vacuum layer 18. Conductive layer 20 may be approximately 1500 Å thick and comprised of indium tin oxide or other conductive material. Luminescent layer 22 is formed onto the bottom surface of conductive layer 20. The luminescent material may be comprised of phosphorous (P) or other luminescent material.

Cathode 8 is parallel to the anode 2. Cathode 8 is also comprised of multiple layers. Cathode 8 has a backing layer 10, a plurality of conductors 12, a resistive layer 24, insulating layer 28, and a gate electrode layer 26. Backing layer 10 may be comprised of a flexible metal layer such as aluminum laminated to a flexible insulating layer 28.

Conductors 12 are located on the interior of the backing layer 10. Conductors 12 includes conductive material such as nibium (Nb), aluminum (Al), or other like elements. Conductors 12, approximately 2,000 Å thick, may be parallel strips that intersect at right angles.

Resistive layer 24 includes resistive material such as silicon (Si) or silicon compounds, is formed on conductors 12 and backing layer 10. The resistive layer may be 10,000 Å–12,000 Å thick. Insulating layer 28 is deposited on top of the resistive layer 24 and may be comprised of silicon dioxide ($SiO_2$). Insulating layer 28 may be 1.0–1.2 $\mu$m thick. Gate electrode layer 26, formed on top of the insulating layer 28, may be comprised of Nb and have a thickness of 2,000 Å. Gate electrode layer 26 may be formed through physical deposition (e.g. sputtering, evaporation, etc.) onto the insulating layer, chemical vapor deposition, or the like.

A gap 917 of approximately 200 $\mu$m exists between the anode 2 and the cathode 8. This gap may be created by inserting a nonconductive layer of approximately the thickness of the gap. A flexible frit 30 may include a material such as glass fibers bound together with epoxy materials is formed between anode 2 and cathode 8.

Spacer 921 supports the display against the atmospheric pressure and allows the display area to grow without increasing the thickness of either the anode or the cathode. To seal anode 2 and cathode 8, the device described above undergoes an annealing process. The annealing process operates at a temperature that causes the epoxy material to melt away. Flexible layer 16 is wrapped over the insulating layer 28 creating a vacuum seal with flexible frit 30. The vacuum or negative pressure in the gap is maintained by flexible frit 30, flexible layer 16, and vacuum layer 18 that is disposed completely around the periphery of the display 1.

A picture is created on a FED having an anode which has a transparent conductive material coating on a transparent display screen. When the electrons collide with the screen, the point of collision forms all or part of a picture element (e.g., pixel) of a displayed image. The higher the rate of collision of electrons with the anode 2, the greater the brightness of the pixel.

FEDs have either active or passive matrix panels. Active and passive matrix panels may be transmissive. Transmissive displays include polysilicon thin-film transistor (TFT) displays and high-resolution polysilicon displays.

FIG. 2 is a schematic diagram of a portion of a passive matrix FED that includes rows 36A–36C of extraction grids and columns 34A–34C of emitters 913. The emitters 913 emit electrons when an appropriate voltage is applied to a row 36A–36C and a column 34A–34C. The shift register 301 receives a horizontal synchronization signal that activates buffers 32A–32C. Buffers 32A–32C provide a grid voltage from a grid voltage generator 31 to rows 36A–36C of the extraction grid. Emitter drive currents are generated by circuits 38A–38C. The emitter drive currents are proportional to the luminance signals to the columns 34A–34C.

FIG. 3 is a schematic diagram of a portion of an active matrix FED. An emitter drive circuit 44 is created by a pair of negative-channel metal oxide semiconductor (NMOS) transistors 40 and 42 together with a resistor that is serially coupled between the emitters 46. FED 50 has one continuous extraction grid 48 that is generally active on a continuous basis when the FED 50 is in use. Emitters 46 are activated by an enable signal that is applied to the gate of transistor 40 in which the transistor 40 acts as a closed switch.

FIG. 4 illustrates a conventional emitter 14. Generally, emitters 14 are cone-shaped where the top of the cone is thinner than the bottom of the cone shape. Emitters 14 may be comprised of conductive material such as molybodenum (Mo) or other suitable material. When an emitter 14 is excited, electrons are emitted from the tip of the emitter which occurs when an enable signal is applied to the gate of a transistor.

FIG. 5 illustrates a cross-sectional view of a FED of the prior art. FEDs have a substrate that has recessed regions for emitters. Spacers are used to separate the anode from the cathode. Phosphor dots are parallel to the substrate. Black matrix is interspersed between the spacers and the phosphor dots.

FIG. 6 illustrates a cross-sectional view of a FED of the prior art. Anode 2 is parallel to cathode 903. Gates are located between emitters. A frit seal 909 is connected to anode 2 and cathode 903. External column driver chip is coupled to the substrate used for cathode 903. Red, green, and blue phosphor dots 70 are parallel to the emitters.

Fabrication of plasma displays is well known in the art and is generally described in U.S. Pat. No. 5,844,373. Plasma displays are typically used for advertisements, portable computers, or any other type of displays that require a large screen size.

As shown in FIG. 7, a plasma display typically comprises a cell such as a liquid crystal cell 901, a plasma cell 4, and a dielectric layer 905 interposed between them. Dielectric layer 905 is thin for driving the liquid crystal cell 901, and a thin plate glass with a thickness of about 50 μm surrounds the dielectric layer 905. The liquid crystal cell 901 includes a substrate 8A that is comprised of glass and electrode 12 that are in the main inner surface of the substrate 8A. Substrate 8A is coupled to the dielectric layer 905. Gap 911 is created using spacers 24. Liquid crystal material fills gap 106.

Plasma cell 4 includes a substrate 22 that is typically comprised of glass and a plurality of electrodes (also referred to as rods) 18 are formed in a stripe pattern on the main surface of the substrate 22. Gap 911 exists between the dielectric layer 905 and substrate 22. Gap 911 is created between dielectric layer 905 and substrate 22 by barrier ribs 907 and frit seals 909 as illustrated in FIG. 9. Barrier ribs 907 are usually 100 to 300 μm in height and 100 μm width. Although barrier ribs 907 are shown on top plasma electrodes, barrier ribs 907 may be spaced apart and not be contacted with the plasma electrodes or barrier ribs 907 may be formed apart from the plasma substrate glass such as on the dielectric layer 905. Frit seals 909 are typically comprised of a low melting glass. An ionizable gas such as helium, neon, argon, xenon or a mixture thereof is sealed in the space created by barrier ribs 907 and frit seal 909. Barrier ribs 907, formed on each of the plasma electrodes by a means such as screen printing process, create space for the plasma cell. Plasma cell 4 is divided by the barrier ribs 907 into stripe portions that constitute electric discharge channels.

Plasma displays create an image based upon the principle that an electrical discharge in an inert gas causes luminescence. A surface discharge display panel has fluorescent material that emit light when excited by ultraviolet light. As voltage is applied sequentially to scanning electrodes, lines on the display screen are selected one by one. In conjunction with the selection of lines, three data electrodes intersect the line that is selected. Because the three data electrodes correspond to primary colors of light such as red, green, and blue, a picture element (e.g. a pixel) is formed on the display screen. A picture element is created when the discharge channel and the signal electrode D intersect.

Three voltages are generally required to form and maintain a display of a plasma display panel: (1) a voltage Va of approximately 50 volts is typically applied to data electrodes; (2) voltage Vs of approximately 180 volts is required for maintaining discharge is applied to the sustaining electrodes; and (3) an entire surface discharge sustaining voltage Vd of approximately 330 volts.

Plasma electrodes 12 act alternately as an anode and a cathode to generate a plasma discharge. The discharge is substantially defined by barrier ribs 907.

As shown in FIG. 8, display electrodes and data electrodes are disposed on the front plate and the base plate. These display electrodes are comprised of discharge scanning electrodes. As mentioned above, while voltage is applied to the discharge sustaining electrodes, lines on the display screen are selected one by one. Three data electrodes correspond to three primary colors such as red (R), green (G), and blue (B). Three points (R, G, B) where the data electrodes intersect the line that is selected by discharge sustaining electrodes and composes a pixel element (e.g. pixel) on the display screen.

Voltage of approximately 50 volts is required for starting a discharge and is applied to the data electrodes. Maintaining the discharge requires a voltage of approximately 180 volts to be applied to both the discharge sustaining and scanning electrodes. Approximately 330 volts is applied to the discharge sustaining electrodes to start a discharge over the entire surface of the display panel (hereinafter referred to as entire-surface discharge). The display panel, therefore, requires a data selection voltage of approximately 50 volts, an entire-surface-discharge-starting voltage of approximately 330 volts, and a discharge-sustaining voltage of approximately 330 volts.

The display is created when voltage is applied to the sustaining electrodes in the entire surface discharge and a ground is applied sequentially to the discharge scanning electrodes, lines are scanned and selected one after another. The data electrodes are driven according to the display data to be displayed on the line, the display cells on the selected line discharge and display the display data. Reading of the display data for each display cell from the I/O buffers drivers the data electrodes. The display cell discharges or does not discharge depending upon whether voltage or ground is applied to the data electrodes.

As shown in FIG. 9, a plasma display has a liquid crystal cell coupled to a dielectric sheet. The liquid crystal cell has a uniformly thin sheet of glass that is approximately 50 μm. The dielectric sheet is also coupled to a plasma cell. The plasma cell is surrounded by an uniformly thin sheet of glass that is approximately 50 μm.

These plates are parallel to each other and are typically comprised of glass. The two glass plates of a plasma display are separated by spacers and sealed and evacuated. One of the glass plates (e.g., face plate) has a screen that has light-emitting material on it or under it, such as plasma, a phosphor, or a color filter or other medium.

FIG. 10 illustrates a rod 14A and a circuit element 18 on the top surface of a cylindrical rod 14A. These rods may take a variety of shapes but they are generally elongated and rectangular in shape.

FIG. 11 illustrates a portion of an array in an active matrix display backplane for a plasma display. Plasma displays may have an alternate type of active matrix liquid crystal array. The control line rows in this device are coupled to gate electrodes along a row and the control line columns are coupled to data drivers which supply pixel voltages which are applied to the pixel electrodes. A column line 34 is connected to a source electrode of field effect transistor (FET). Another column line is coupled to a source electrode of FET. A row line 32 is coupled to the gates of both FETs 36 and 37. The drain of FET 36 is coupled through capacitor 923 to a transparent pixel electrode along the row 32 formed by FETs 36 and 37, and the drain of FET 37 is coupled through a capacitor to another pixel electrode along the row. In one typical example, the backplane may be formed by depositing rods using an FSA technique into a rigid substrate (e.g., glass). Each rod contains a FET and a capacitor and is interconnected to other rods by column and row conductors that are deposited onto the rigid substrate; and, the capacitor is coupled to a pixel electrode by another conductor that is deposited onto the rigid substrate. The active medium (e.g., plasma) is placed between the base and face plates which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes are not now drawn to scale, but are shown schematically for the purposes of illustration. The interconnect (e.g., rods) between the rows and columns is comprised of flexible and conductive material. For example, the interconnect could be made of aluminum, copper, gold or other conductive materials.

A circuit using a complimentary metal oxide semiconductor (CMOS) technology (not shown) and a diffused metal on silicon (DMOS) transistor are also used in a plasma display. CMOS is used for illumination and pulse control and generally relates to linking a PMOS (a semiconductor doped with a p-type dopant) transistor device with an NMOS (a semiconductor doped with n-type dopant) device. CMOS is used outside of the array. DMOS is used for high power plasma displays.

There are several disadvantages inherent to display devices such as FEDs. For example, the FED described in U.S. Pat. No. 5,818,165 discloses a FED in which the plurality of emitters and gates are created on one layer of the cathode of the FED. This is inefficient because a portion of the emitters will be inoperable. Additionally, FEDs are typically manufactured by using deterministic methods to place driver chips and spacers onto one of the layers of the cathode. This reduces productivity because it is more efficient to use a method in which premanufactured objects are quickly placed onto a layer.

Another disadvantage to existing FEDs is that they are typically manufactured in a batch operation. Batch operations inherently involve a certain amount of down-time in production. This increases aggregate production time to fabricate display panels. Moreover, flat-panel displays are generally fabricated on substrates which are not continuous in length. This also decreases productivity since the assembly of the flat-panel displays is interrupted until another panel is available to assemble the flat-panel display.

There are also several disadvantages associated with conventional plasma displays. For example, plasma displays are also manufactured using deterministic methods with regard to placing rods onto one of the glass plates such as the base plate. This reduces productivity because it is more efficient to use a method in which objects are quickly placed onto the rigid substrate, such as through fluidic self assembly. Another disadvantage to plasma displays is that they are also typically manufactured in a batch operation. It is therefore desirable to have a method of manufacturing display devices such as FEDs and plasma displays that overcome the disadvantages associated with conventional display device.

SUMMARY OF THE INVENTION

One aspect of the present invention provides various apparatuses and methods for creating a FED using the process of fluidic self-assembly (FSA) to assemble objects (e.g., blocks having emitters and gates, spacers, and driver chips) into a substrate.

Another aspect of the invention relates to creating blocks having a plurality of emitters and gates. While creating emitters and gates are known in the art, segregating blocks having emitters and gates from a substrate is new. This feature allows the blocks to be tested prior to being assembled onto a receiving substrate. The blocks are separated from the substrate by using an etchant such as hydrofluoric acid.

Another aspect of the invention relates to an operation that occurs after the FSA has been performed. To verify that the FSA process results in complete placement of objects, a "pick and place" process is utilized. "Pick and place" allows the objects to be placed into empty recessed regions on the receiving substrate which were missed during the FSA process. The substrate is first checked for empty recessed regions by using an electronic eye that views the substrate for empty recessed regions. Once an empty recessed region is detected, a robot is used to "pick and place" an object into an empty recessed region of the substrate.

Another embodiment of the invention relates to fluidic self assembly (FSA) that is used to place rods with all of the necessary logic such as control logic that is in each rod onto at least one substrate. These rods form a portion of the backplane that is used in an active matrix plasma display. FSA may also be used to place barrier ribs and spacers onto a substrate.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example. The invention is not limited to the figures of the accompanying drawings in which like references indicate similar elements. Additionally, the drawings are not drawn to scale.

FIGS. 14A–14E show another embodiment of a double-template transfer in accordance with one embodiment of the invention.

DETAILED DESCRIPTION

Figure 1:
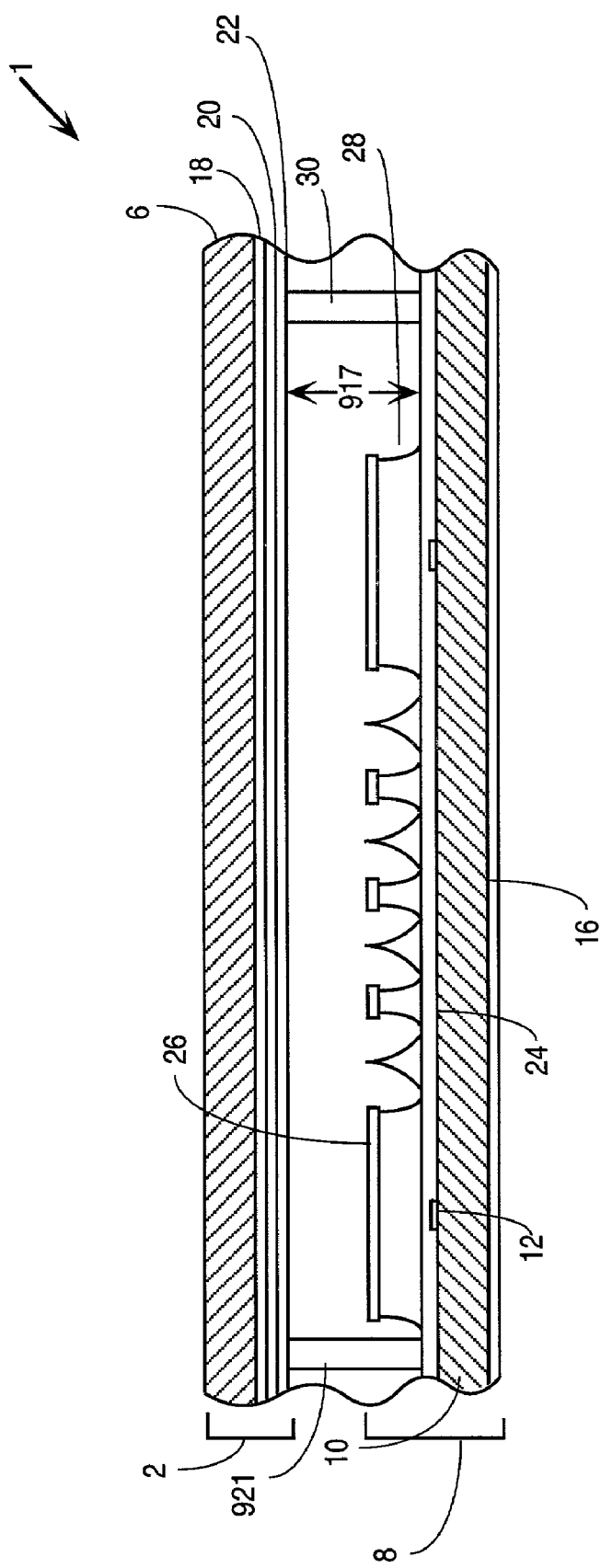
FIG. 1 illustrates a cross-sectional view of a FED in the prior art.
Figure 2:
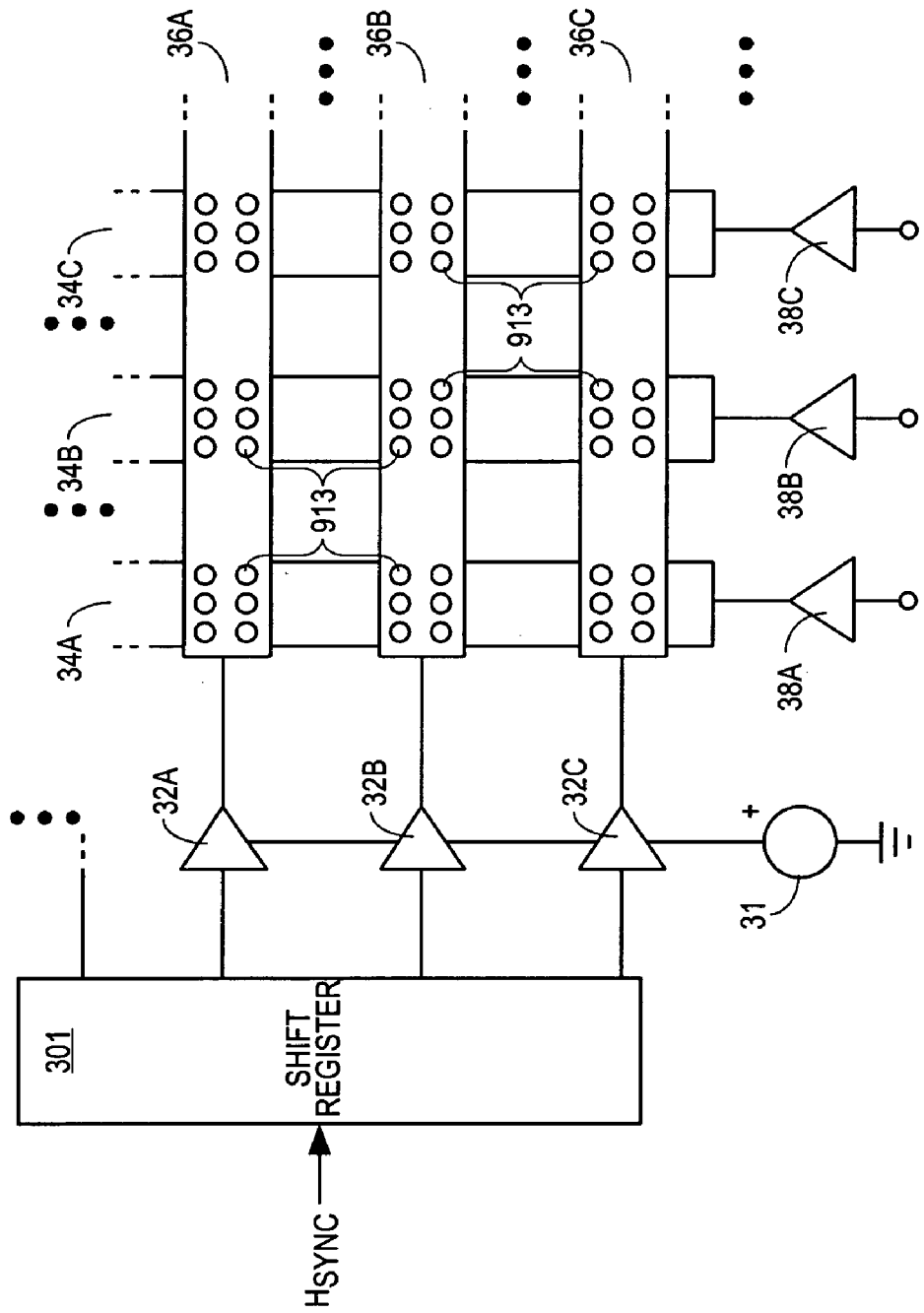
FIG. 2 illustrates a passive matrix for a FED in the prior art.
Figure 3:
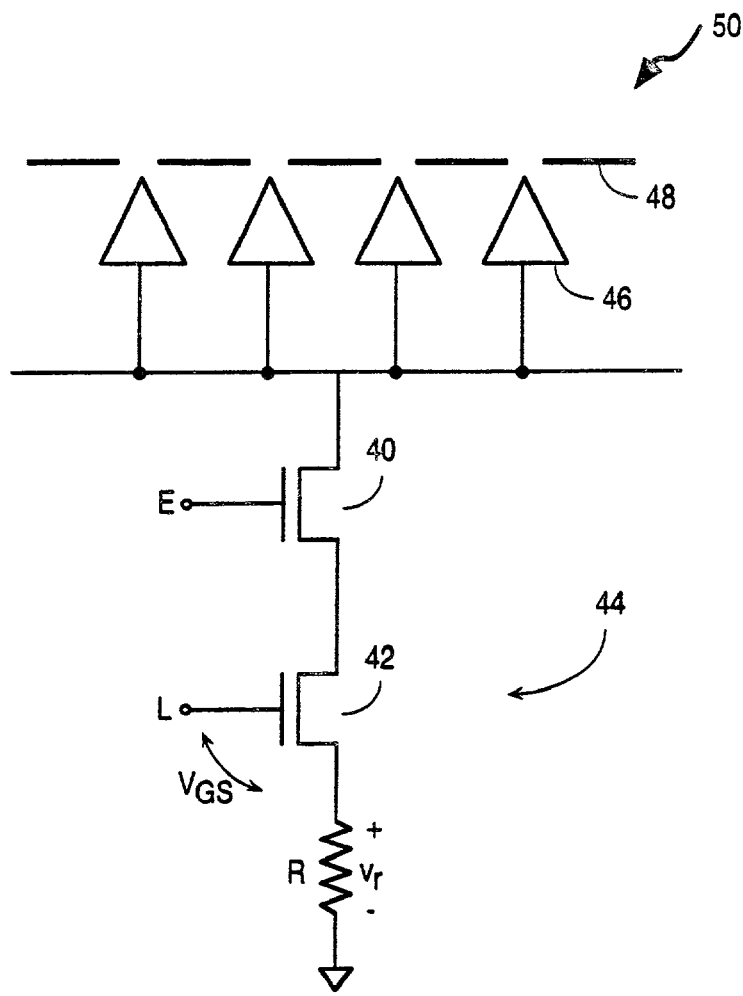
FIG. 3 illustrates an active matrix for an FED in the prior art.
Figure 4:
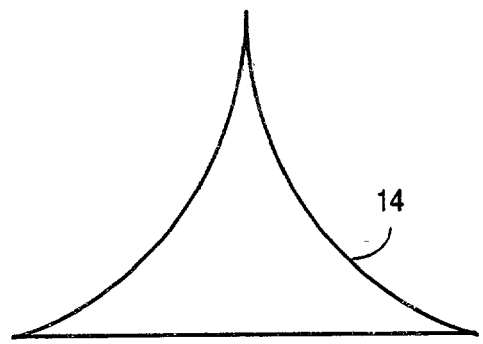
FIG. 4 illustrates an emitter in the prior art.
Figure 5:
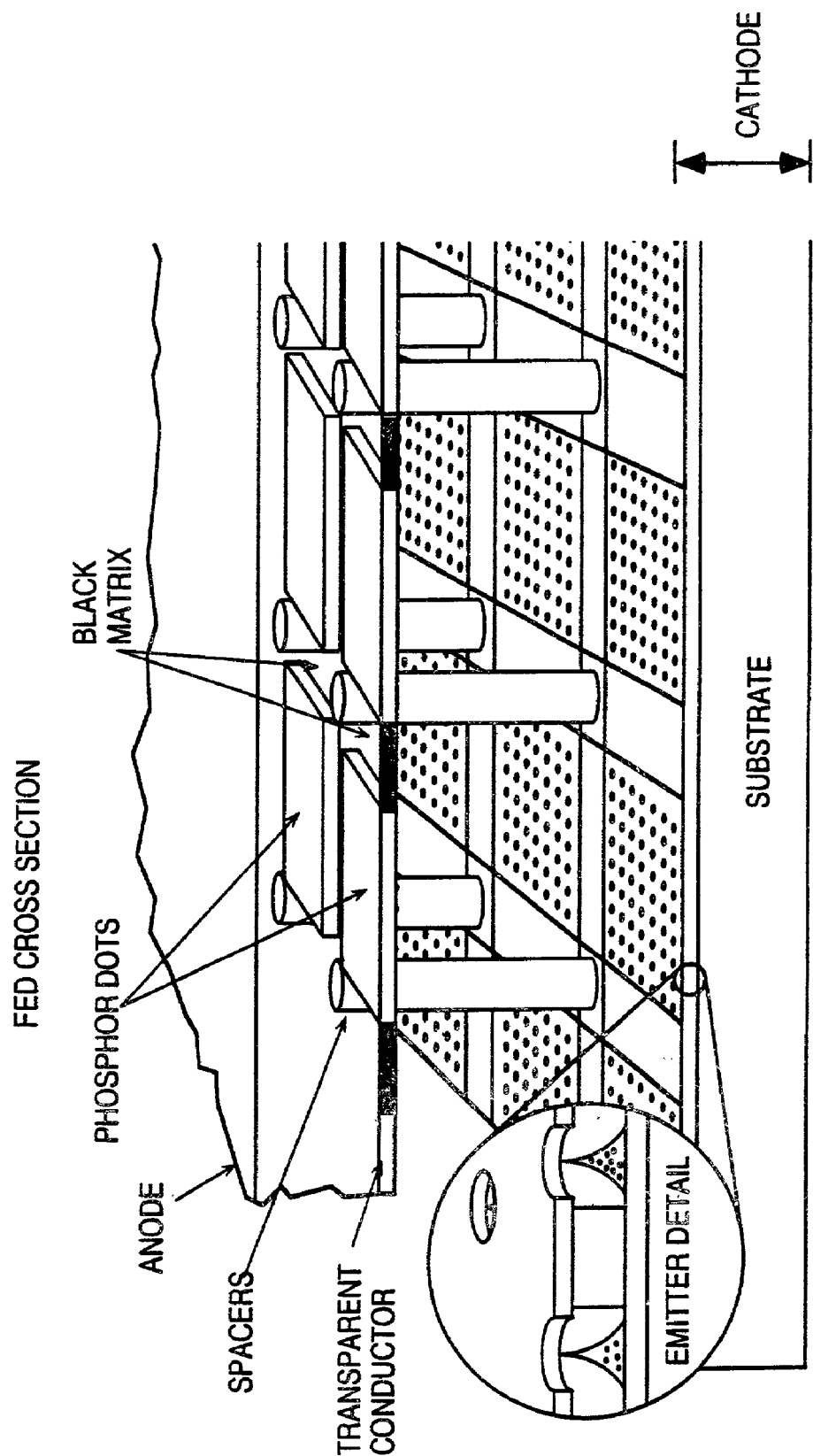
FIG. 5 illustrates a cross-sectional side view of a FED in the prior art.
Figure 6:
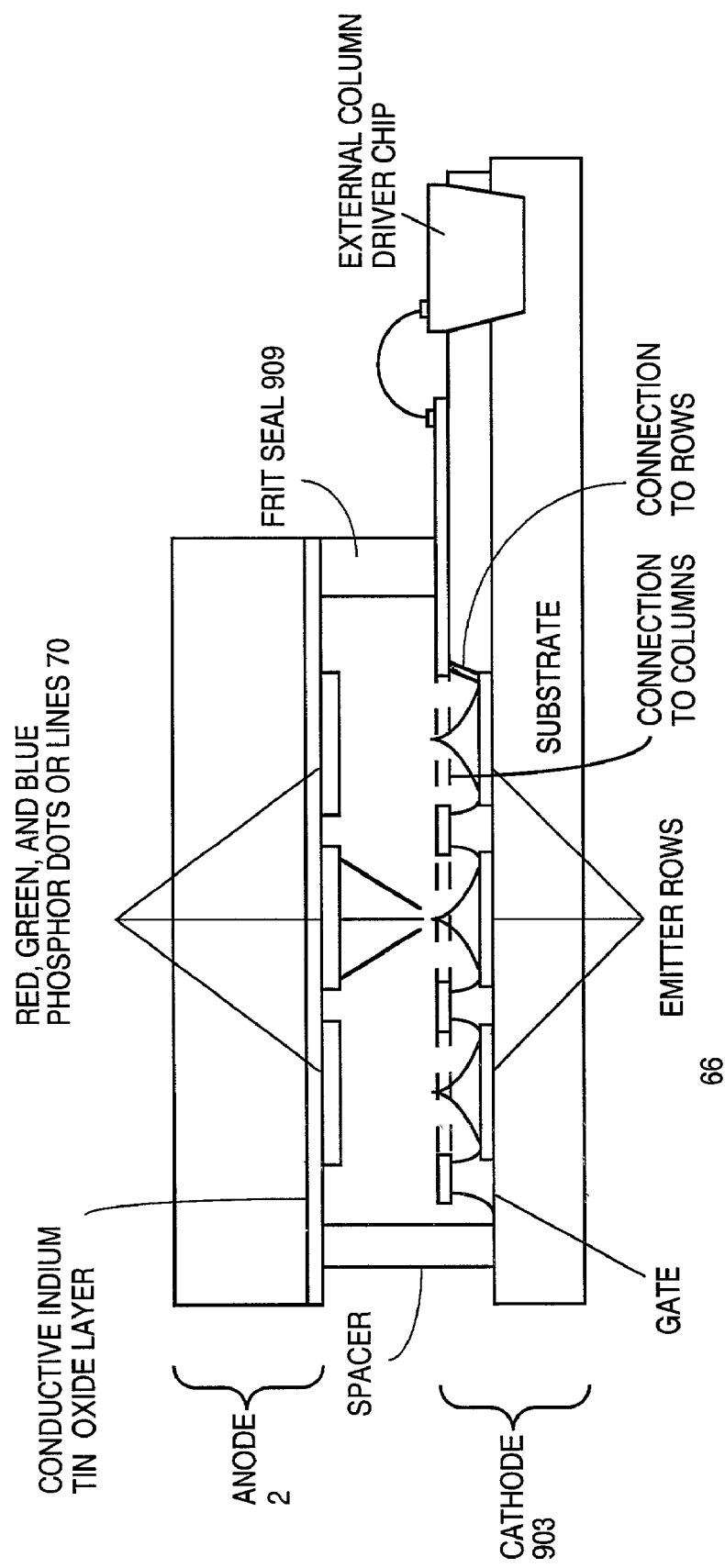
FIG. 6 illustrates a planar side view of a FED in the prior art.
Figure 7:
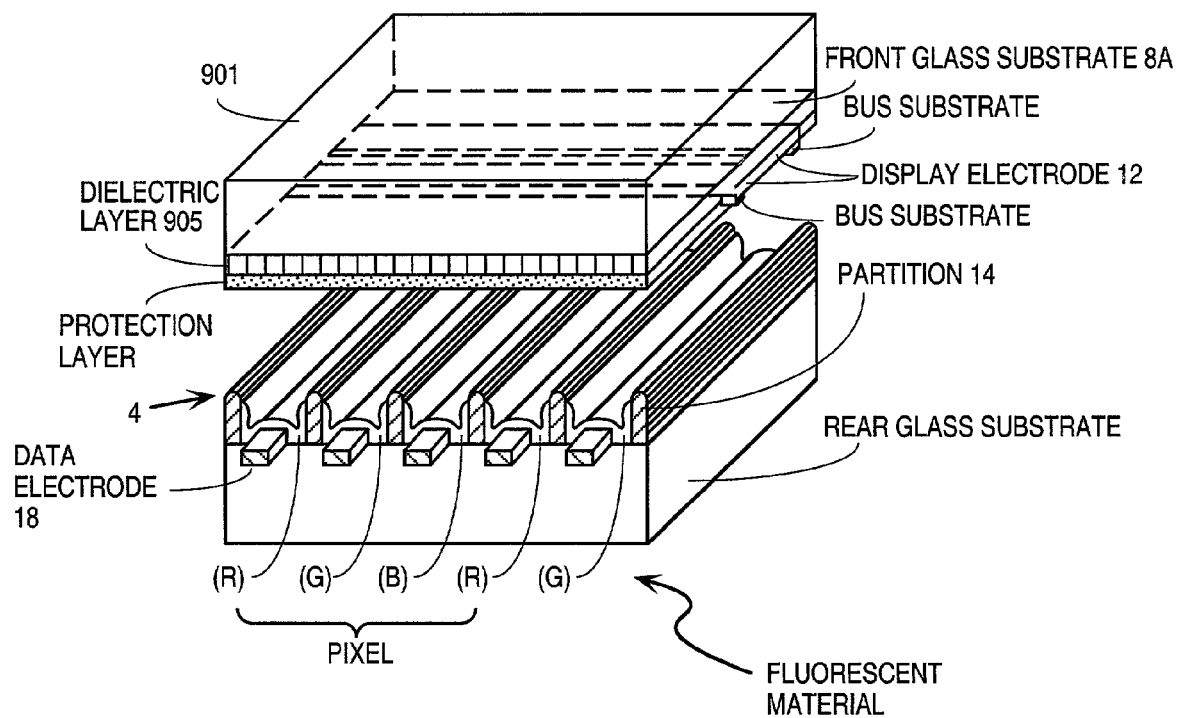
FIG. 7 illustrates a configuration of a plasma display panel of the prior art.
Figure 8:
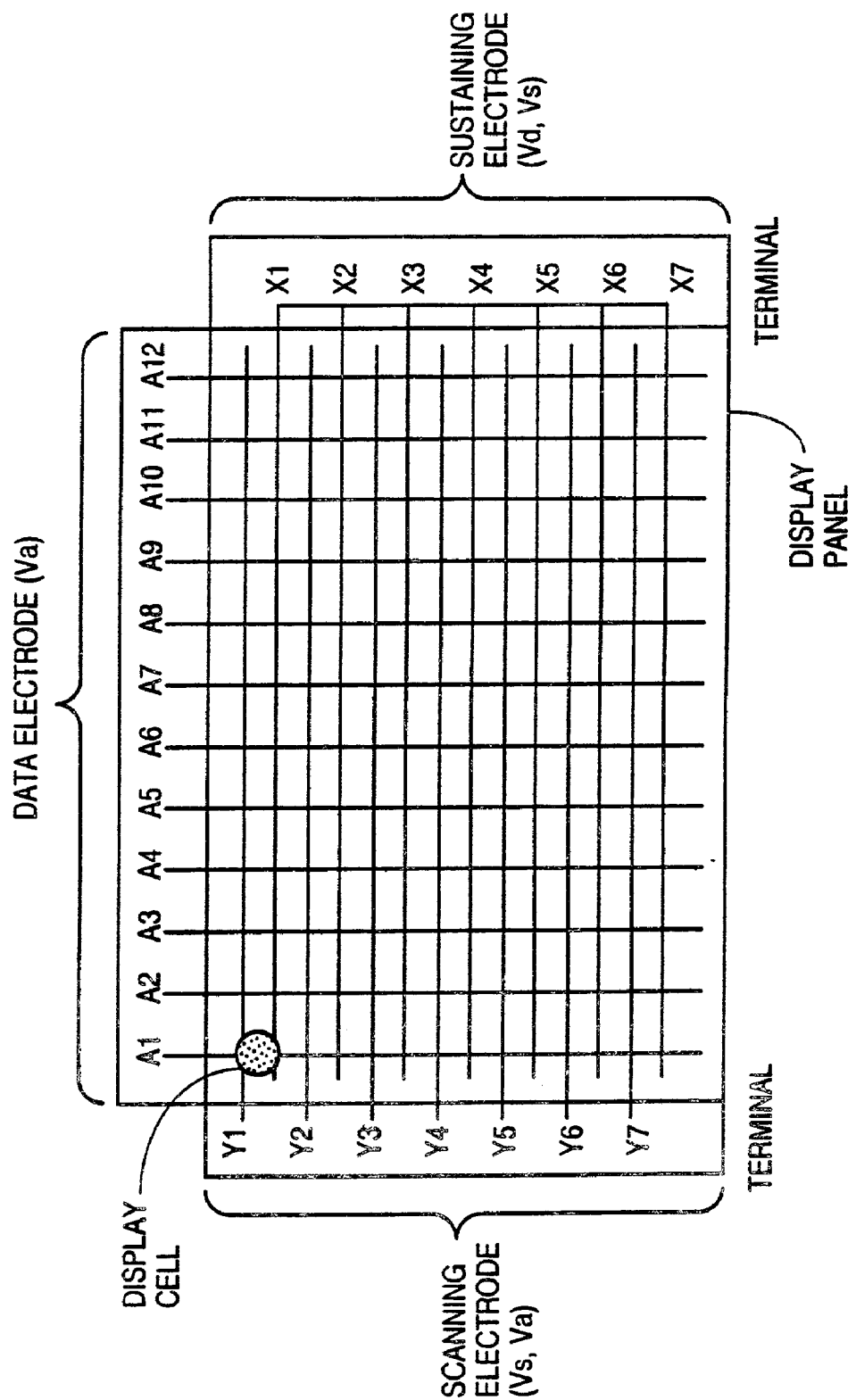
FIG. 8 illustrates a configuration of electrodes of a plasma display panel of the prior art.
Figure 9:
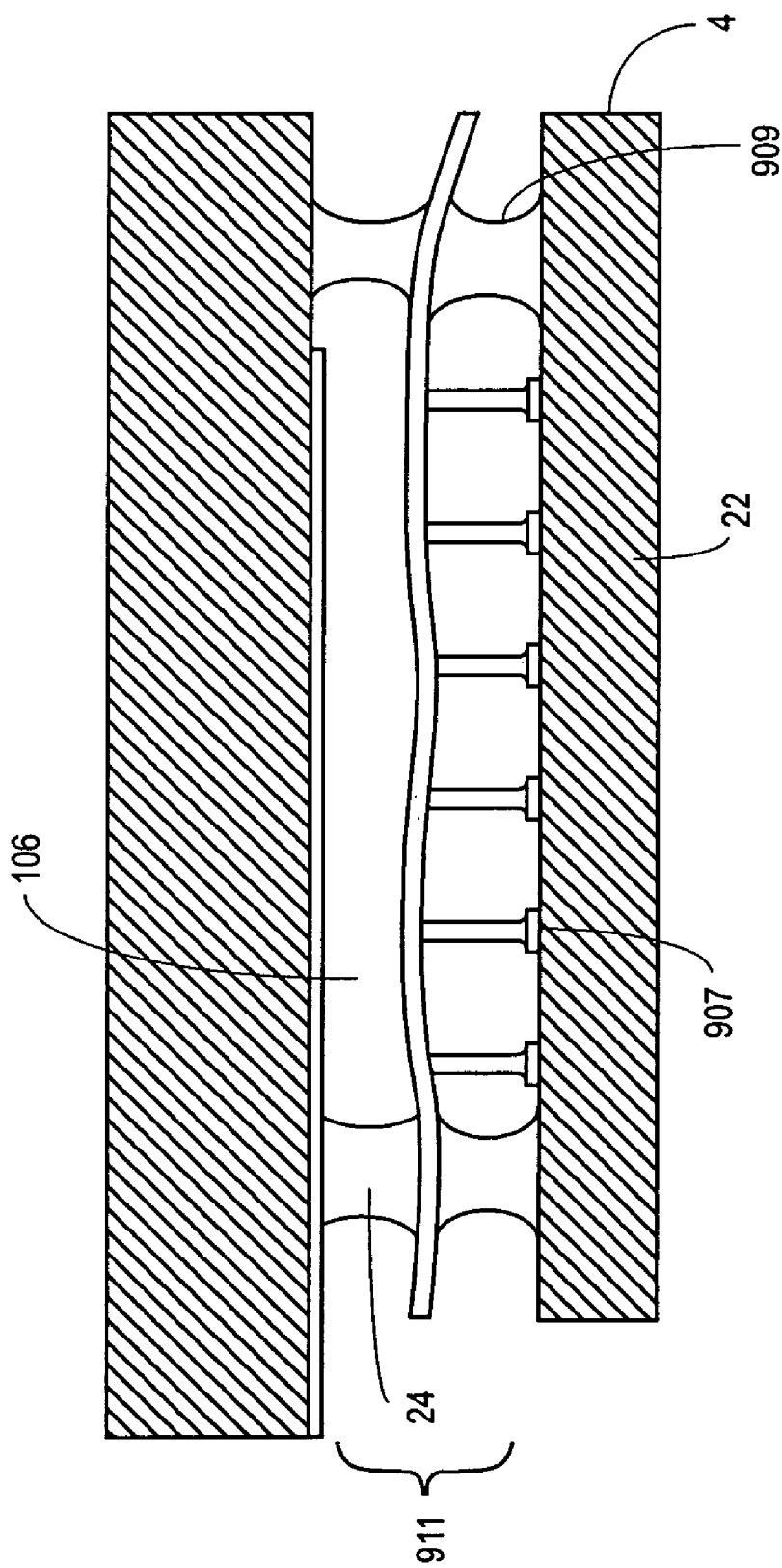
FIG. 9 illustrates a planar side view of a plasma display of the prior art.
Figure 10:
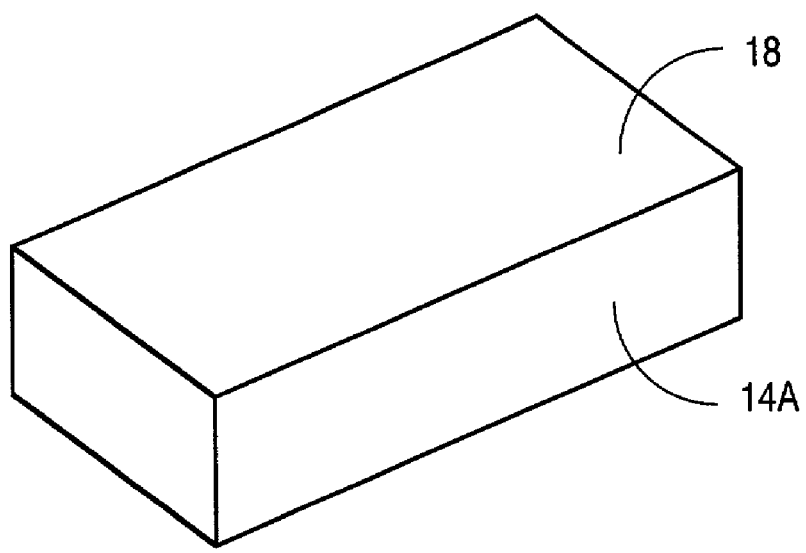
FIG. 10 illustrates a rod of the prior art.
Figure 11:
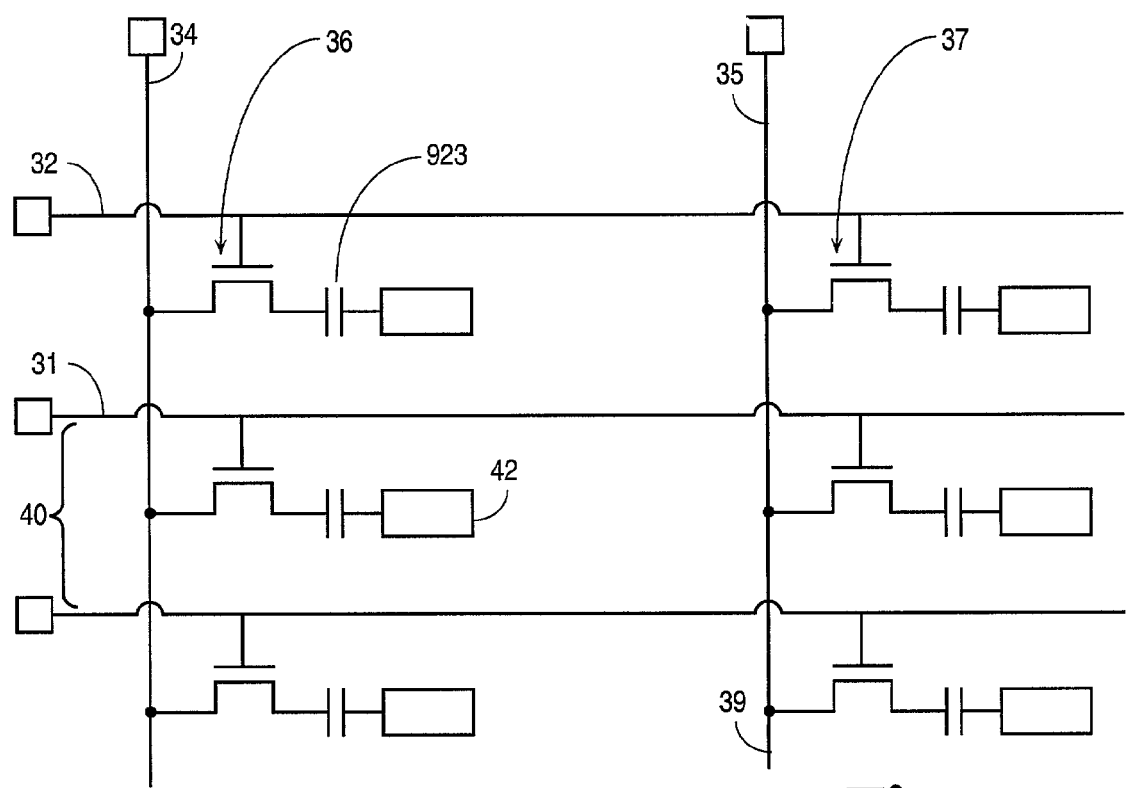
FIG. 11 illustrates an array in an active matrix of a plasma display of the prior art.

The present invention relates to apparatuses and methods for forming displays and other electronic assemblies. The following description and drawings are illustrative of the invention and are not to be construed as limiting the invention.

One embodiment of the invention relates to using FSA to form a display such as a FED display. Incorporated by reference is U.S. Pat. No. 5,545,291 explaining how to assemble objects onto a substrate using FSA. The FSA with a plurality of objects is deposited onto the substrate wherein the objects fall into recessed regions found in the substrate. One embodiment has the objects (e.g., blocks having emitters and gates, spacers, and driver chips) being transferred at one time.

The various objects may be placed into recessed regions of a substrate by using FSA first for the largest objects. After the largest objects are placed in the largest recessed regions of the substrate using a first slurry, a second slurry containing the next smallest size objects is dispensed onto the substrate. In an alternative embodiment, all of the various sized objects could be placed into a slurry and dispensed at one time over a substrate. After the objects have been dispensed onto the substrate, the substrate is then advanced to a further point in the process in which an interconnect layer is deposited onto the substrate. While the substrate is advanced, a display tape is advanced to a point where the substrate becomes coupled to the display tape.

In another embodiment of the invention, various rods, each containing a functional component, may be fabricated on one substrate and then separated from that substrate and assembled onto a separate rigid substrate through FSA.

Another embodiment of the invention relates to the FSA process wherein, after the objects are deposited on the substrate, they fall into recessed regions found in the substrate. After a certain time period, the substrate is checked for any existing empty recessed regions. Finding empty recessed regions is accomplished by using an electronic eye attached to a machine which is able to view the surface of the substrate. A robot or a person is used to place an object into an empty recessed region.

In the following description, numerous specific details such as specific materials, processing parameters, processing steps, etc., are set forth in order to provide a thorough understanding of the invention. One skilled in the art will recognize that these details need not be specifically adhered to in order to practice the claimed invention. In other instances, well known processing steps, materials, etc., are not set forth in order not to obscure the invention.

Field Emission Displays (FEDs) are described followed by Plasma Displays. A substrate refers to either a rigid substrate or a flexible substrate. A rigid substrate may comprise glass, soda lime glass, silicon, plastic, quartz, or other suitable material. Flexible substrates may be comprised of PES, polyethylene terephthalate, polycarbonate, polybutylene terephthalate, PPS, polypropylene, polyester, aramid, PAI, polyimide, aromatic polyimides, polyetherimide, metallic materials, ABS, PVC, or other suitable material.

Figure 12A:
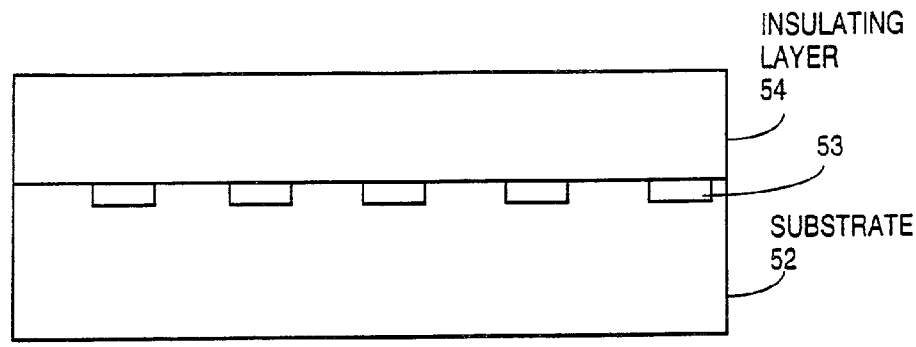
FIGS. 12A–12O show an assembly of blocks having emitters and gates, spacers, and driver chips on a substrate.
Figure 12B:
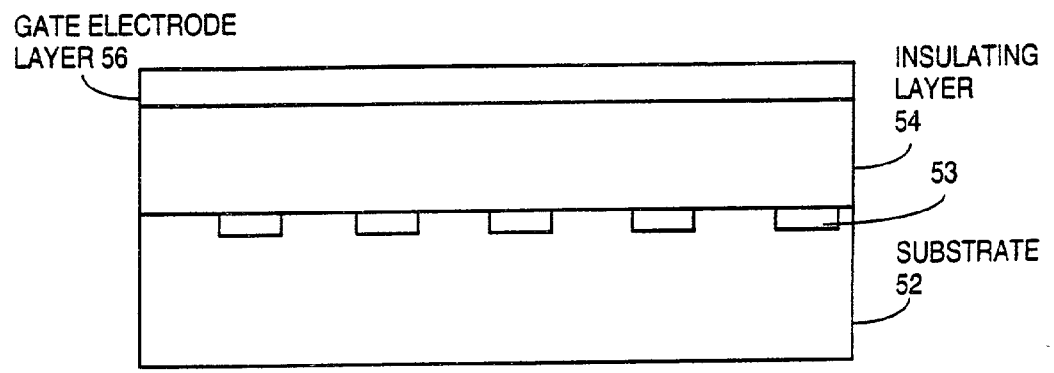
Figure 12C:
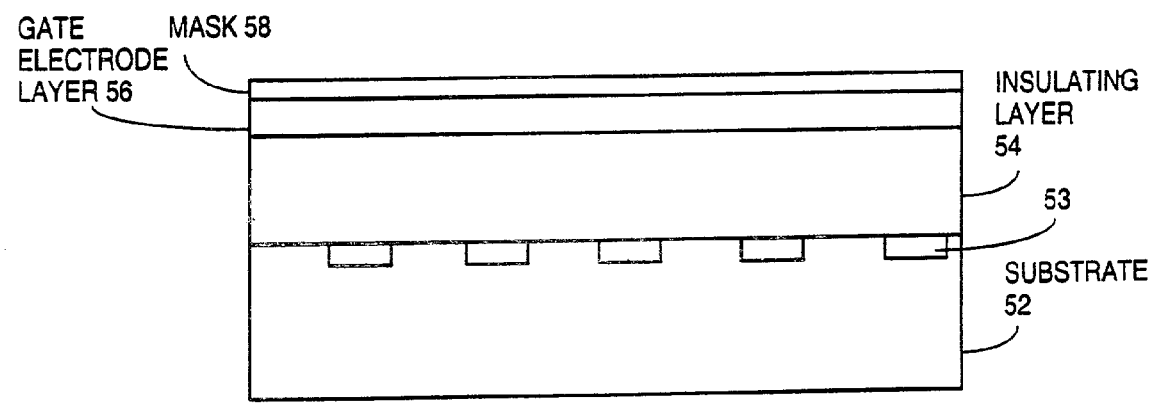
Figure 12D:
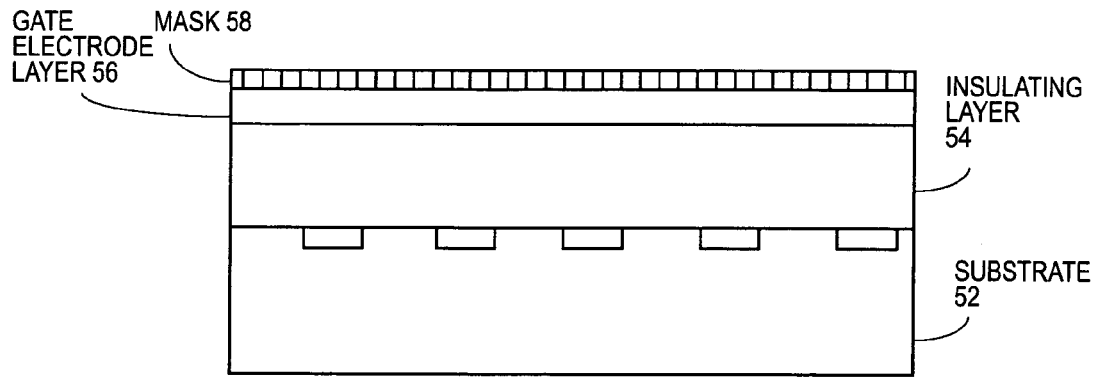
Figure 12E:
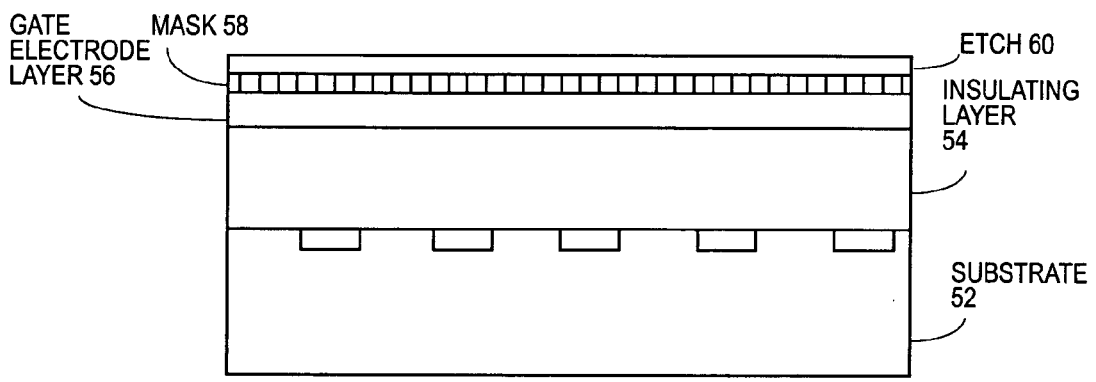
Figure 12F:
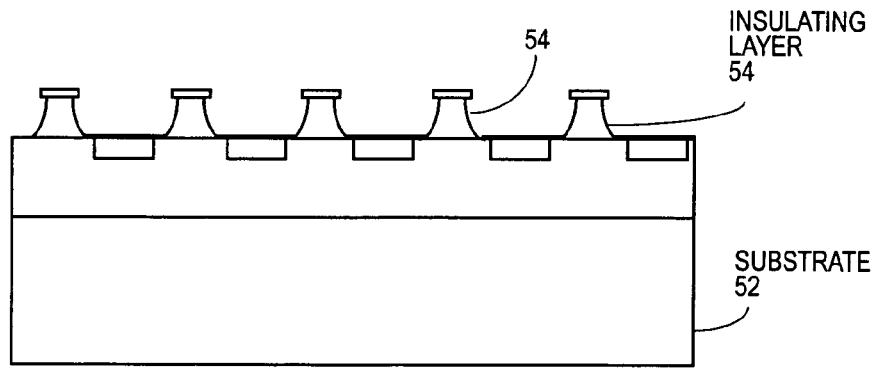
Figure 12G:
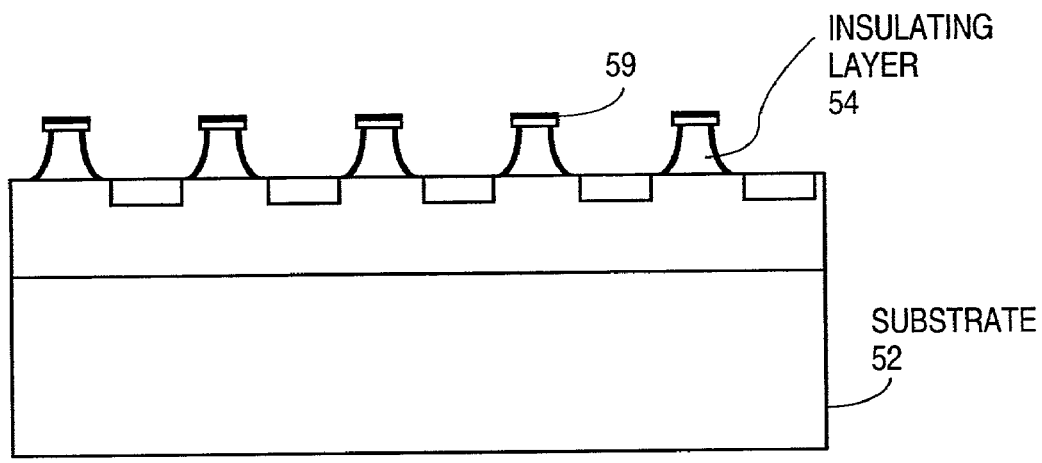
Figure 12H:
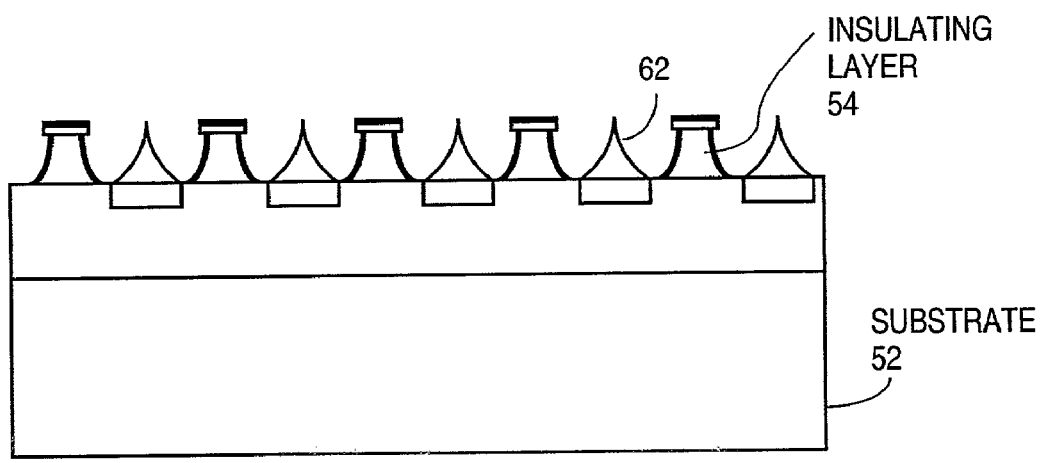
Figure 12I:
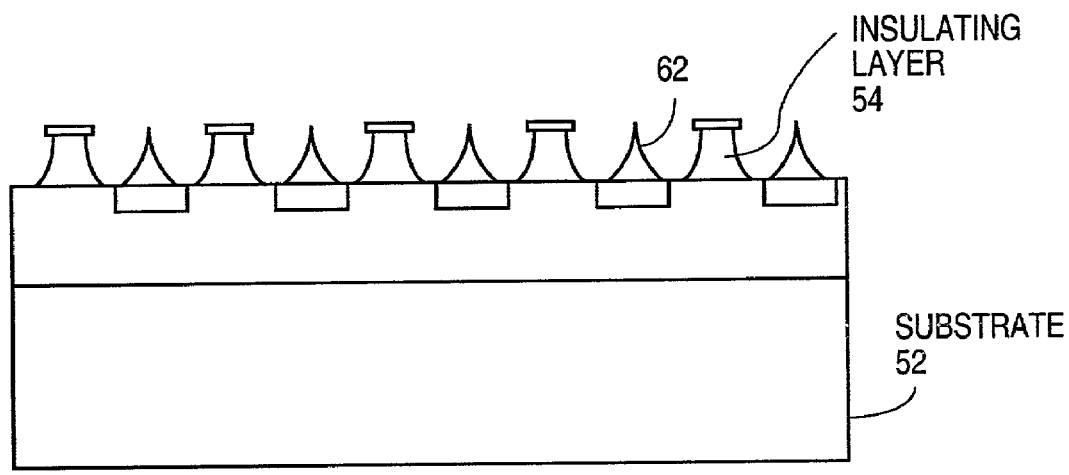
Figure 12J:
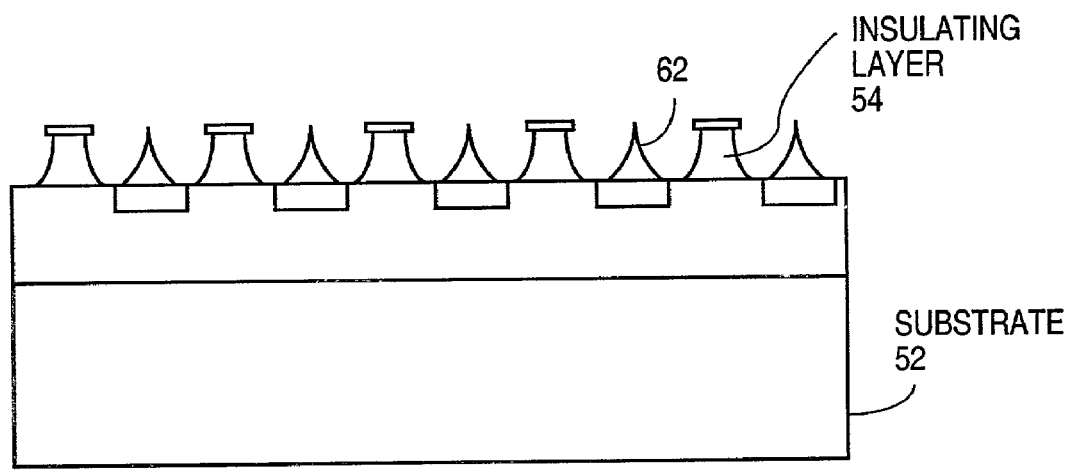
Figure 12K:
Figure 12L:
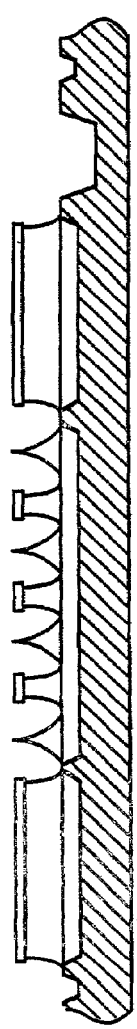
Figure 12M:
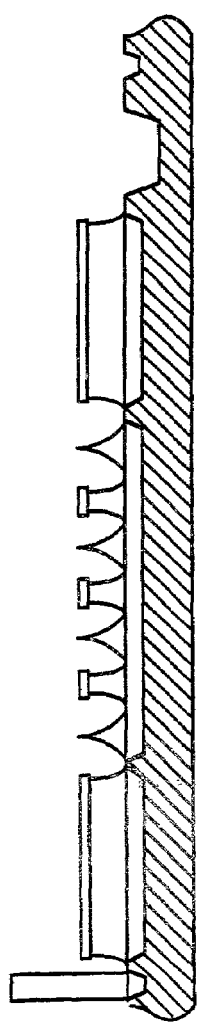
Figure 12N:
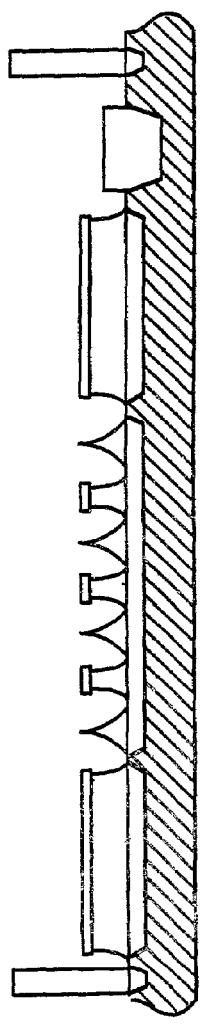
Figure 12O:
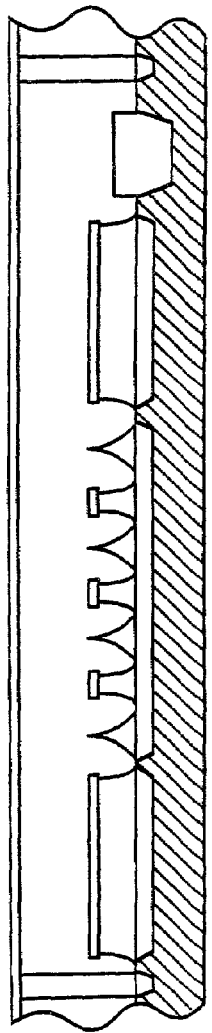

FIGS. 12A–12O illustrate an assembly of blocks and spacers onto a substrate. Blocks having emitters and gates which are created by using photolithography and by applying a mask and etch material. Then, an etching material is applied to the substrate comprised of glass. An assembly of the type described herein may be used in credit cards, watches, computers, televisions, radar, computer displays, a variety of like displays, or electronic devices.

FIG. 12A illustrates a first substrate 52 in accordance with one embodiment of the invention. First substrate 52 is comprised of a rigid material such as glass. First substrate 52 is coupled with an insulating layer 54 deposited thereon. Insulating layer 54 may be comprised of insulating materials such silicon dioxide ($SiO_2$) and may have a thickness of 1.0–1.2 $\mu$m. Dielectric material 53 is sandwiched between the insulating layer 54 and first substrate 52. FIG. 12B illustrates a gate electrode layer 56 deposited on the surface of the insulating layer 54. Gate electrode layer 56 may be formed by sputtering, evaporation onto the insulating layer, chemical vapor deposition, or other suitable operation. Gate electrode layer 56 is comprised of conductive materials such as Nb and may have a thickness up to 2,000 Å. FIG. 12C illustrates a masking material such as conventional photoresist deposited on gate electrode layer 56. Mask 58 is used for designation of areas which are not to be etched. This masking material may form a layer that has a thickness of approximately 2 microns. FIG. 12D illustrates the same device as in FIG. 12C, but the masking material is shown to mark designated layers on the gate electrode layer 56. FIG. 12E illustrates a layer of etchant 60 deposited on top of the masking layer as show in FIG. 12D. The etchant used depends on the metallization used. The mask and etch of the device in FIG. 12E create cavities in the insulating and gate electrode layers. FIG. 12F illustrates a lift-off layer of material, such as nickel, deposited by an electron beam deposition process, or other suitable methods, over the gate electrode layer 56 to form a sacrificial lift-off layer. FIG. 12G illustrates a sacrificial layer 59 comprised of some type of photoresist on top of the device shown in FIG. 12F. FIG. 12H illustrates a conductive tip material 62 (e.g., molybodenum (Mo)) deposited within each cavity by using a beam of electrons which are normal to the apertures created in the insulating and gate electrode layers. Thereafter, a material such as a variety of acids is used to lift-off the blocks having the emitters and gates from the substrate. FIG. 12I illustrates a material such as hydrofluoric acid that separates a block with the emitters and gates which creates the device in FIG. 12J. FIG. 12J illustrates a block that holds a plurality of emitters and gates. Although the block shows five emitters and five gates, there may be a greater or lesser amount of emitters and gates created on the blocks. By fabricating a plurality of blocks with emitters and gates thereon, these microelements may be tested to ensure that they are operable before the objects are placed on the substrate (or a flexible layer). FIG. 12K illustrates a substrate with recessed regions created within the substrate. There are shaped recessed regions of various sizes for the purpose of receiving a variety of objects. FIG. 12L illustrates blocks having emitters and gates that have slid into the recessed regions f the substrate. These blocks were placed into their respective positions through the FSA process. FIG. 12M illustrates a spacer that has been placed into a recessed which is slightly larger in diameter than the spacer itself. The spacer also was placed in this position through the FSA process (or through the "pick and place" method if the FSA process does not place the spacer into a recessed region for the spacer). FIG. 12N illustrates the same device as in FIG. 12M except that a driver chip has been placed into a recessed region which has a diameter which is slightly larger than the driver chip itself. The driver chip also was placed in this position through the FSA process. FIG. 12O illustrates a first substrate and a second substrate coupled together. The first substrate forms a portion of the cathode and the second substrate forms a portion of the anode.

Figure 13A:
FIGS. 13A–13E show a double-template transfer of objects to a substrate in accordance with one embodiment of the invention.
Figure 13B:
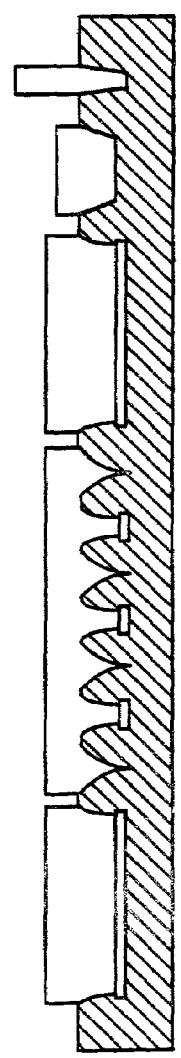
Figure 13C:
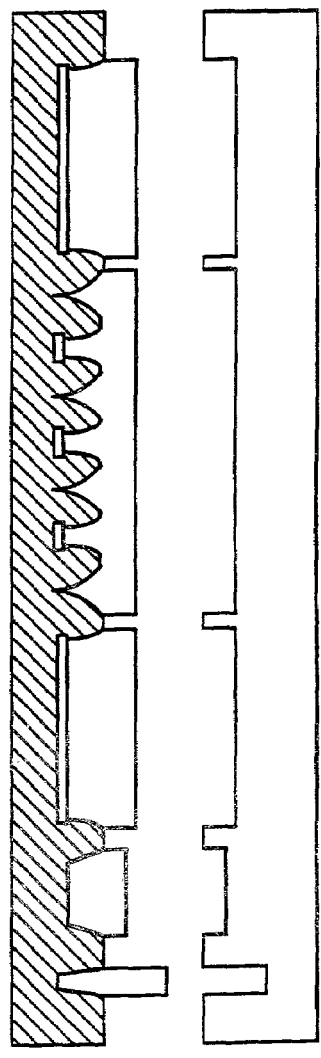
Figure 13D:
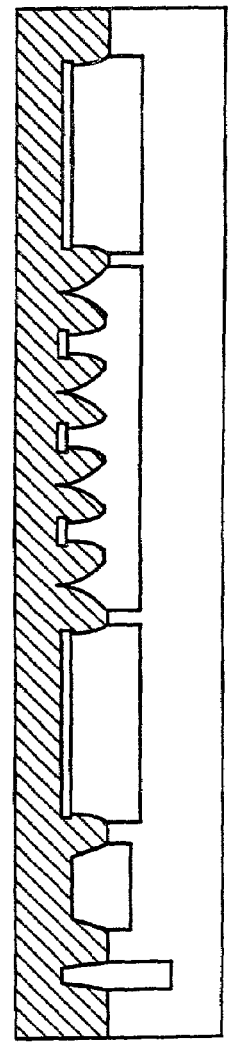
Figure 13E:
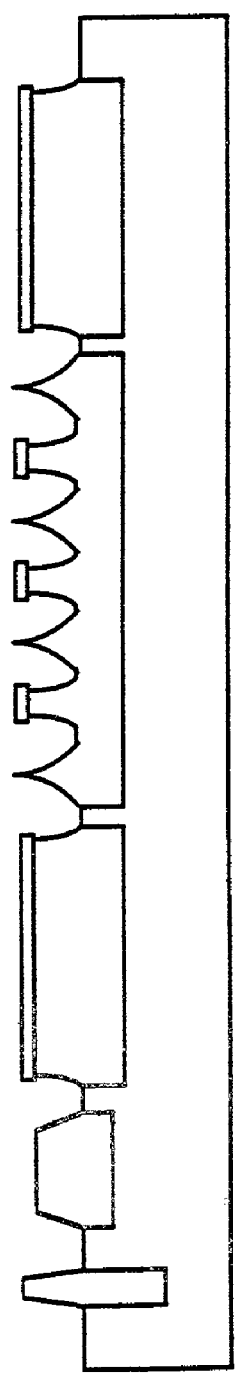

FIGS. 13A–13E illustrate another embodiment of the invention involving template transfer of a plurality of objects. FIG. 13A illustrates recessed regions that are a variety of shapes. These various shapes allow for the various sized objects to be placed into their respective sized shaped recessed regions. The recessed regions are slightly larger than the objects that they are to receive. FIG. 13B illustrates a first template in which the FSA process was used to place a plurality of objects into their respective regions by use of a vacuum pump. The plurality of objects may be held in place by a variety of methods such as through a vacuum being applied to the first template. If the vacuum is applied during the FSA process, the plurality of objects may be attracted to their respective regions. Another method involves using release tape on the first template. Release tape has a Teflon (e.g., PFA) backing that is made by Norton Performance Plastics. The release tape holds the plurality of objects in place. After the objects are seated in the first template, the release tape is placed on top of the plurality of objects. FIG. 13C illustrates the first template as in FIG. 13B in which a second template having at least one side that has recessed regions faces the first template with a plurality of objects protruding therefrom. FIG. 13D illustrates a template being coupled to the receiving substrate wherein the various sized objects are inserted into the receiving substrate. FIG. 13E illustrates that the templates are detached from one another. A plurality of objects are released from the first template by a variety of methods. For example, if a vacuum is used to hold the blocks in place, the vacuum is broken allowing the plurality of objects to be released from the first template. If release tape is used to hold the plurality of objects to the first template, the first template is heated allowing the release tape to release the plurality of objects. Heat may be applied by a variety of methods. For example, convection may be used to transfer heat to the first template. The material may be placed between the first template and the heat source. The materials used should be able to conduct heat.

FIGS. 14A–14E illustrate another embodiment of the double-template transfer in which individual types of objects are transferred to a receiving substrate. While these figures show the end result of each type of object transferred to recessed regions made to receive that particular object, the steps used to transfer a type of object is based upon the double-template transfer method as illustrated in U.S. patent application Ser. No. 09/270,159 entitled "Methods and Apparatus for Fabricating A Multiple Modular Assembly, now U.S. Pat. No. 6,316,278." FIG. 14A illustrates a template that has various shaped recessed regions. FIG. 14B illustrates the transfer of a first shaped object to the template. For example, a block having emitters and gates is shown to be transferred to the first template by FSA. If FSA is unable to transfer all of the blocks to the first template, the "pick and place" method may be used to place the block onto the first template. The double-template transfer, as described above, may then be used to transfer the plurality of blocks to the first template. FIG. 14D illustrates that a spacer has been transferred to the first template. FIGS. 14C–14D illustrates the plurality of objects have been transferred completely using the methods described herein such as FSA or "pick and phase." FIG. 14E illustrates a second template coupled to the first template. The plurality of objects can be released from the first template and are attached to the second template similar to previously discussed with relation to FIG. 13E. The plurality of objects is released from the first template for example by breaking the vacuum. If release tape is used to hold the blocks in place, a plurality of objects are released by applying heat to the tape causing the plurality of objects to be released.

While FIGS. 14A–14E illustrate the single transfer of blocks having emitters and gates, driver chips, and spacers, these objects could undergo double-template transfer in a different order. For example, the driver chip could be placed first into recessed regions rather than using FSA to place the blocks first onto the first template. Similarly, any combination of two or more objects may be placed onto the first template by FSA using the double-template method described above.

Figure 15:
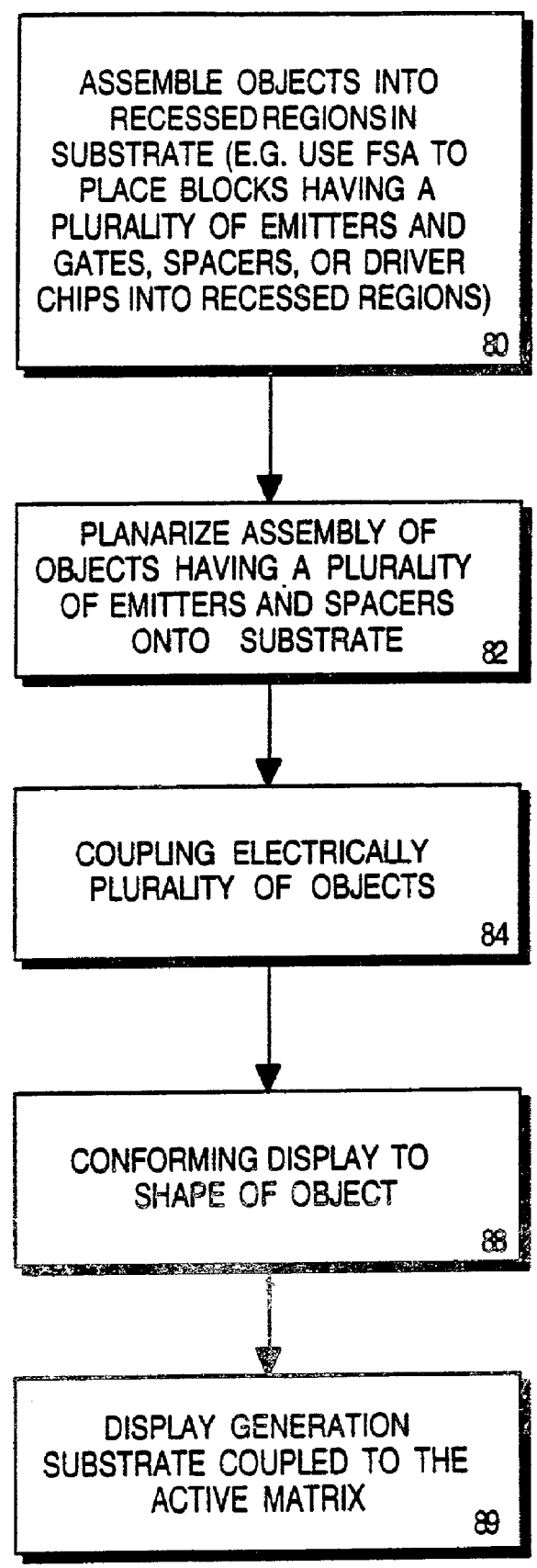
FIG. 15 illustrates a flow chart of the method of assembling a display by depositing blocks having emitters and spacers onto the substrate in accordance with one embodiment of the invention.

FIG. 15 illustrates one method of assembling a display along the length of a substrate in accordance with an embodiment of the invention. Objects are assembled into the openings of the substrate at operation 80. Utilizing an FSA process, blocks having a plurality of emitters and gates are deposited in a slurry. The blocks then go into the recessed regions of the substrate by sliding into recessed regions of the substrate. A plurality of spacers is then deposited onto the substrate. The spacers then slide into recessed regions of the substrate. Driver chips also may be deposited onto the substrate. Planarization of the assembly of objects into a substrate is the next operation 82. A variety of methods may be used to planarize the various objects. For example, planarization may take place by depositing a material which may be used to flatten the plurality of objects or may be subjected to conventional chemical-mechanical polishing. Then, the electrical coupling of the plurality of blocks takes place at 84 by opening holes in the planarization layer and depositing metalization material or other conductive materials into the holes and beyond the holes to form an interconnect (e.g., a row or column interconnect) between the blocks. The display is made to conform the object's shape at operation 88. A display generation substrate (e.g., a phosphor layer) is coupled to the active matrix backplane at operation 89.

Figure 16:
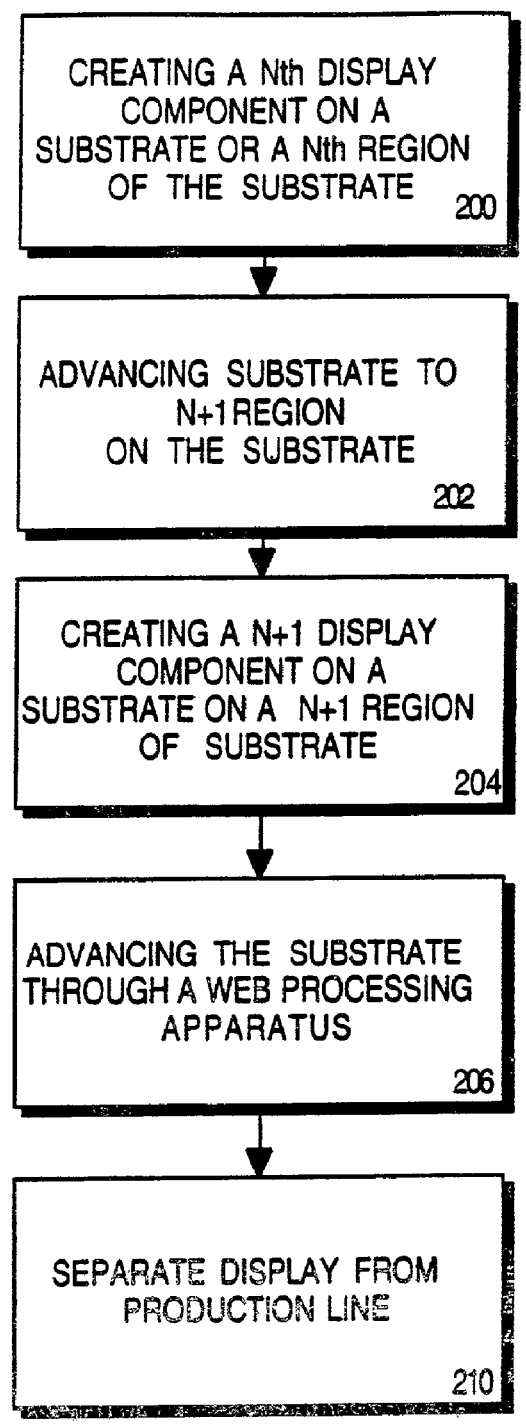
FIG. 16 illustrates a flowchart of the method of manufacturing multiple displays along a substrate in accordance with one embodiment of the invention.

FIG. 16 illustrates a method of manufacturing multiple displays along a substrate. Multiple display components are created on a substrate at operation 200. The substrate is advanced to a second region of the substrate at operation 202. A new display component is created on the substrate in a different region of the substrate at operation 204 by advancing the substrate through a web processing apparatus at operation 206. Separation of the display panel from the production line occurs at the end of the process at operation 210.

Figure 17:
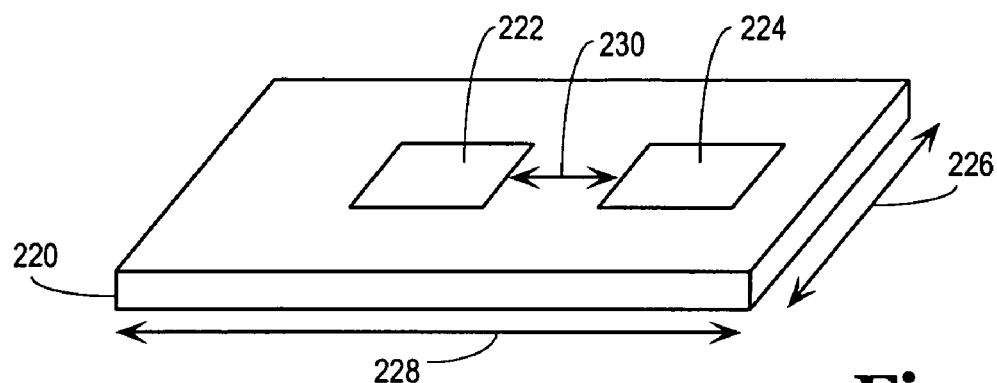
FIG. 17 illustrates a top view of a substrate with multiple display components fabricated thereon in accordance with one embodiment of the invention.

FIG. 17 illustrates a substrate with multiple display components. Substrate 220 has display component 222 and display component 224 attached thereto. Substrate 220 has three lengths: a first length 226, a second length 228, and a third length 230. Display components 222 and 224 are active matrix display devices.

Figure 18:
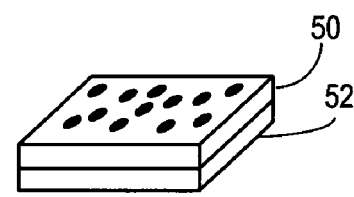
FIG. 18 illustrates a top view of a display component which has an active matrix display backplane attached thereto in accordance with one embodiment of the invention.

FIG. 18 illustrates a first substrate 50 attached to a passive display backplane 52 that may be used to form a display device.

Figure 19:
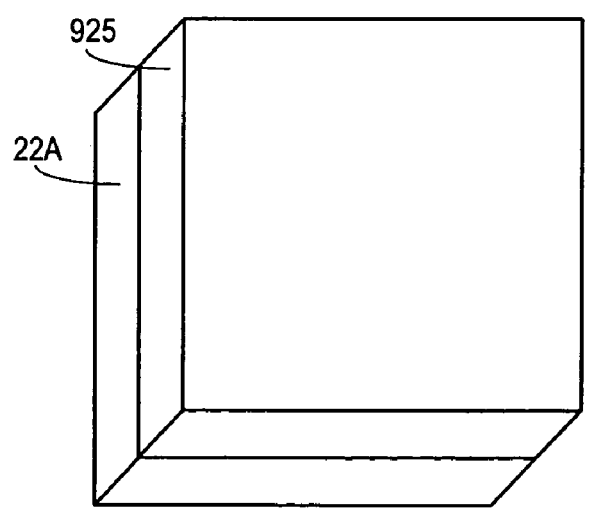
FIG. 19 illustrates a top view of substrate attached to a display backplane in accordance with one embodiment of the invention.

FIG. 19 illustrates a display component 925 that has an active matrix display backplane 22A attached thereto that may be used to form a display device.

Figure 20A:
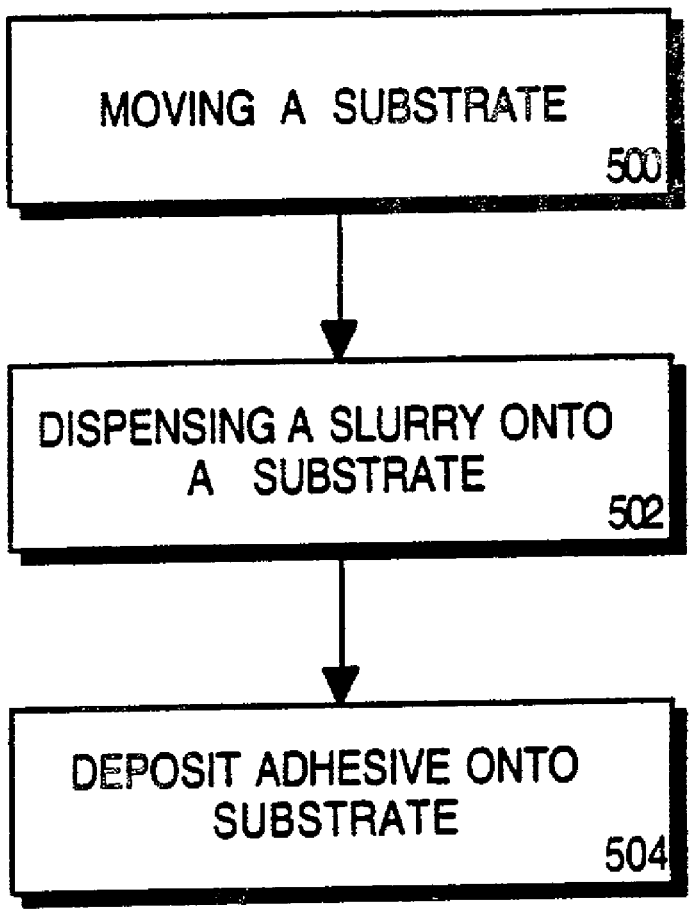
FIG. 20A illustrates a flow chart of a method of fabricating a display device wherein a substrate and a display tape undergo processing and are subsequently coupled in accordance with one embodiment of the invention.

FIG. 20A illustrates a method of fabricating a display device in which a substrate and a display tape undergo processing and are subsequently coupled. The substrate is advanced along a process line at operation 500. A first slurry containing a plurality of blocks in which each block has a plurality of emitters and gates is dispensed onto the substrate at operation 502. The first slurry also may contain a variety of additional objects such as driver chips and spacers. This is the preferred embodiment. Other embodiments entail each individual object separately dispensed onto the substrate and each object slides into recessed regions that are slightly longer than the objects that they are set to receive. In these embodiments, each type of object has its own container before it is dispensed and each type of object is separately recycled.

A second slurry containing a plurality of blocks, spacers, and driver chips is again dispensed onto the substrate in order to fill each recessed region that was not filled by dispensing the first slurry. Excess slurry is collected in a container and is recycled. The blocks, spacers, and driver chips slide into the recessed regions that they are sized to fit. Adhesives are then deposited onto the substrate at operation 504.

Figure 20B:
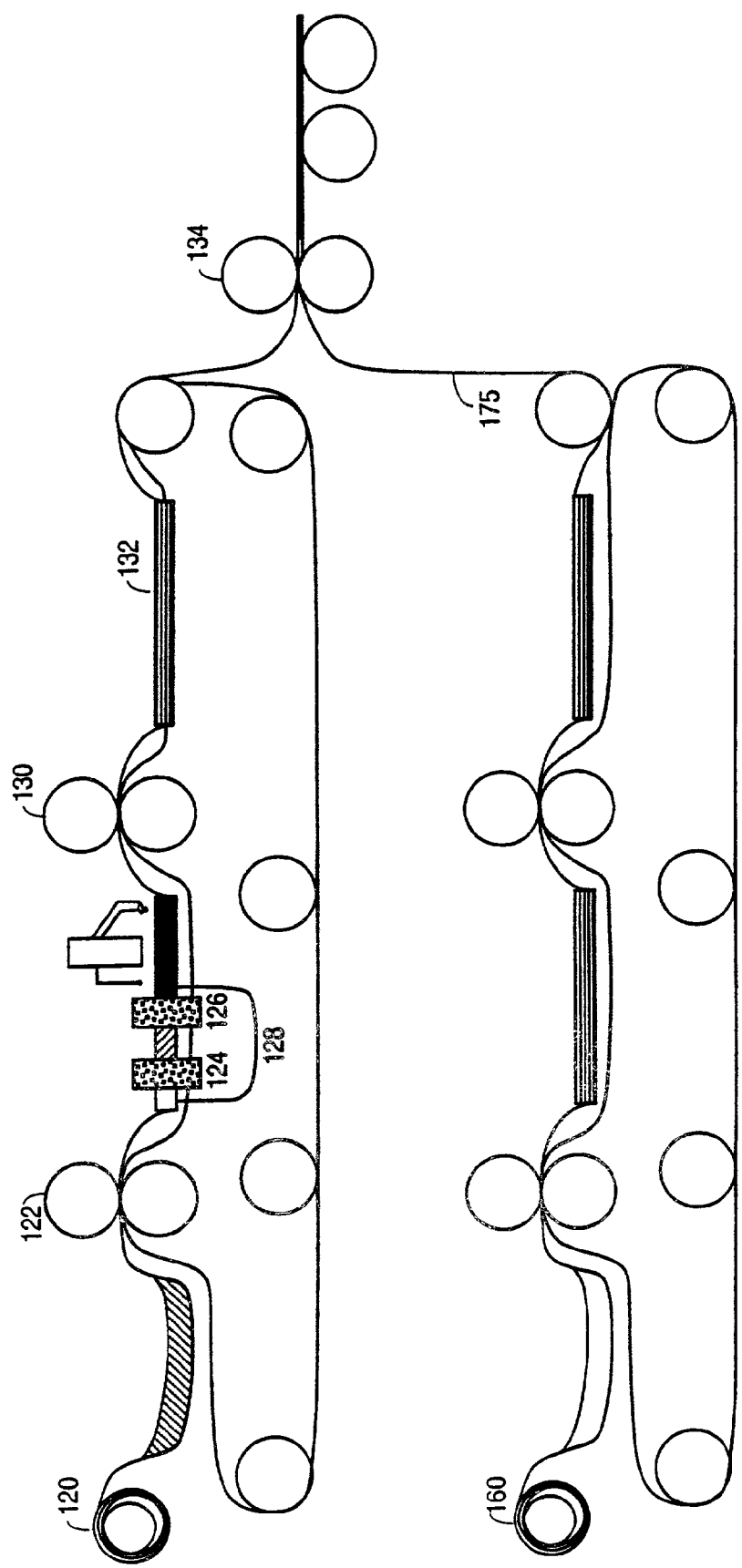
FIG. 20B illustrates a method of fabricating a display device wherein a substrate and a display tape undergo processing and are subsequently coupled in accordance with one embodiment of the invention.

FIG. 20B illustrates the overall process of fabricating a display device in which a first substrate 120 and a second substrate 160 undergo processing and are subsequently coupled. The first substrate is advanced along a first process line and advances through a first set of support members 122. A first slurry 124 containing a plurality of blocks having emitters thereon, spacers, and driver chips is dispensed onto the first substrate. A second slurry 126 containing a plurality of objects (e.g. blocks, spacers, and driver chips) is again dispensed onto the first substrate. Excess slurry is collected in a container 128 and is recycled. The blocks fall into recessed regions in the substrate. First substrate 120 is advanced through a second set of support members 130. At operation 132, the first substrate undergoes planarization as illustrated in FIGS. 26A–26D. The first substrate is then advanced to point 134. At operation 175, a second substrate is coupled to the first substrate. While the process may follow the operation outlined below, it will be appreciated that it is also possible that one portion of the display will be singulated prior to the second substrate being secured to the first substrate.

Figure 21:
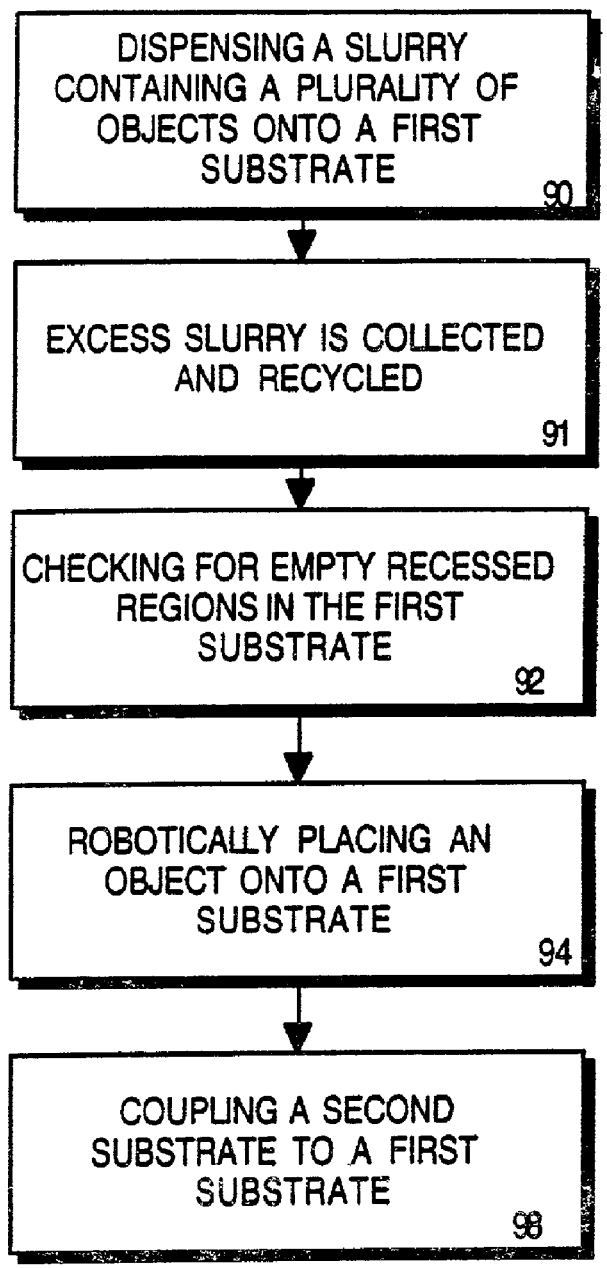
FIG. 21 illustrates a flow chart of a method of the picking and placing objects onto a substrate after the FSA process has been applied to the substrate in accordance with one embodiment of the invention.

FIG. 21 relates to a method of picking and placing of objects onto a substrate after the FSA process has been applied to the substrate. A slurry containing a plurality of objects is dispensed onto the substrate at operation 90. Then the objects fall into recessed regions in the substrate. The excess slurry is collected and recycled at operation 91. The substrate is checked for empty recessed regions at operation 92. This checking is performed by an electronic eye which views the substrate. Objects are robotically placed into empty regions found in substrate at operation 94. At operation 98, the second substrate is coupled to the first substrate.

Figure 22:
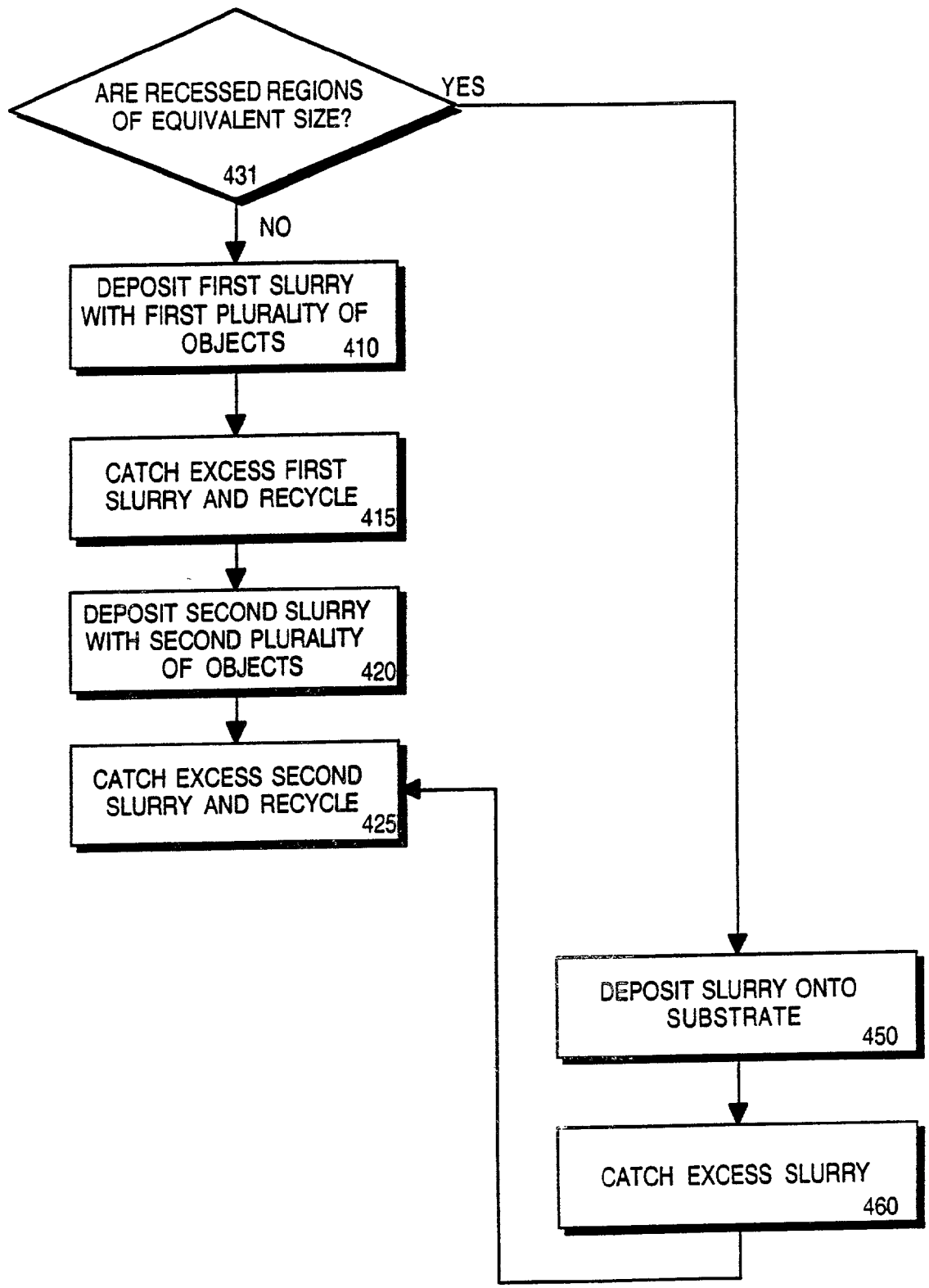
FIG. 22 illustrates a flow chart which relates to the FSA process and the coupling of the display material to the substrate in accordance with one embodiment of the invention.

FIG. 22 relates to the FSA process and the coupling of the display material with the substrate. At operation 431, it is determined whether the recessed regions are equivalent in size. A slurry containing a plurality of blocks having emitters and gates thereon is deposited onto the substrate at 410. If the recessed regions are of equivalent size, operation 450 is then followed. A single slurry is deposited onto a substrate at operation 450. (Excess slurry is caught and recycled at operation 460.) If the recessed regions are not of equivalent size (e.g., the blocks have varying numbers of emitters), operation 410 is followed. A first slurry with a first plurality of objects is deposited onto the substrate at operation 410. Excess slurry is caught and recycled at operation 415. Once this operation is performed, a second slurry with a second plurality of objects is placed onto the substrate at operation 420. Excess second slurry is recycled into a second container at operation 425.

Figure 23:
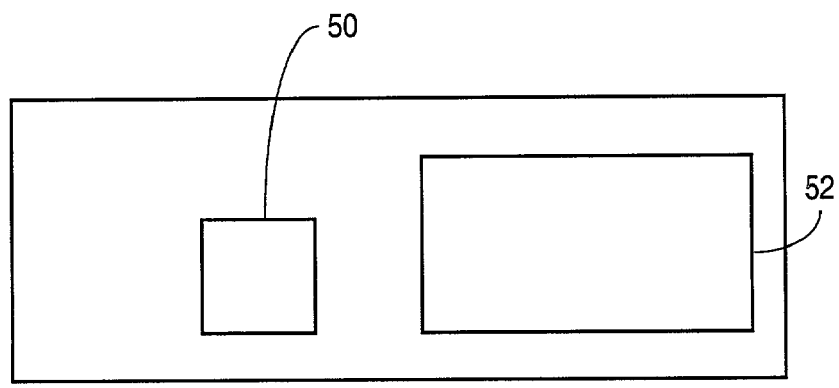
FIG. 23 illustrates a top view of a continuous substrate wherein displays of different sizes are created in accordance with one embodiment of the invention.
Figure 24:
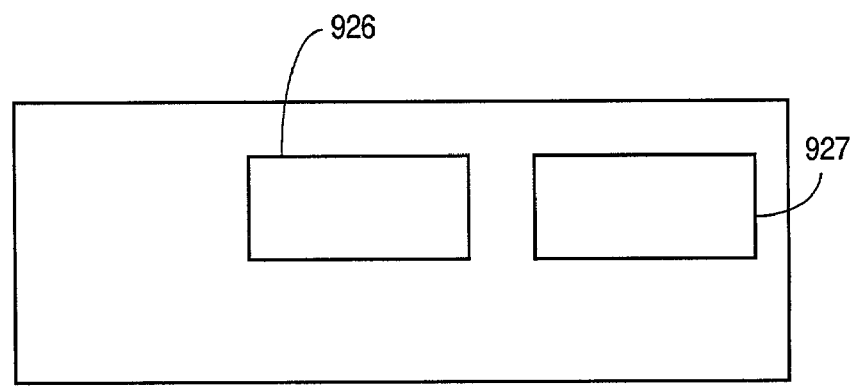
FIG. 24 illustrates a top view of a continuous substrate wherein displays of similar size are created in accordance with one embodiment of the invention.

FIG. 23 illustrates a continuous substrate in which two displays are created. Display device 52 is larger than display device 50. This shows that multiple displays of different sizes can be created on the substrate through an in-line process. Alternatively, FIG. 24 illustrates displays 926 and 927 of similar size.

Figure 25:
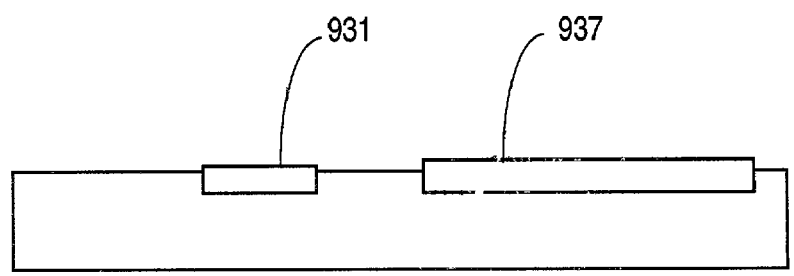
FIG. 25 illustrates a planar side view of the recessed regions in the substrate in accordance with one embodiment of the invention.

In addition to multiple displays being able to be made different sizes, the substrate itself may have different sized recessed regions. This allows the substrate to receive various sized blocks or devices. FIG. 25 illustrates a cross-sectional view of the recessed regions in the substrate. Recessed region 931 is smaller than recessed region 937.

Figure 26A:
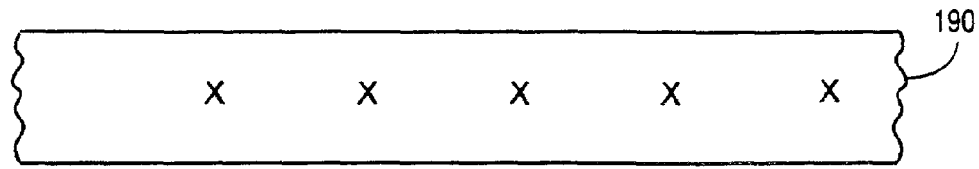
FIG. 26A illustrates a planar side view of a substrate in accordance with one embodiment of the invention.
Figure 26B:
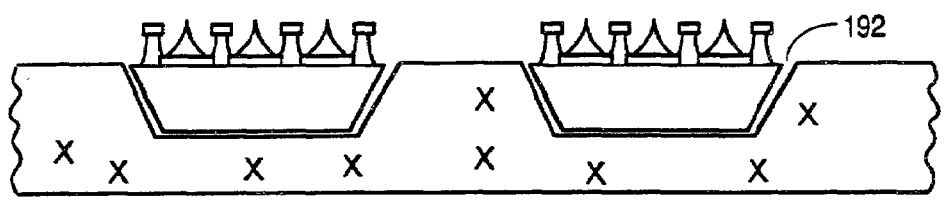
FIG. 26B illustrates openings or receptor regions created and emitters deposited onto the substrate in accordance with one embodiment of the invention.
Figure 26C:
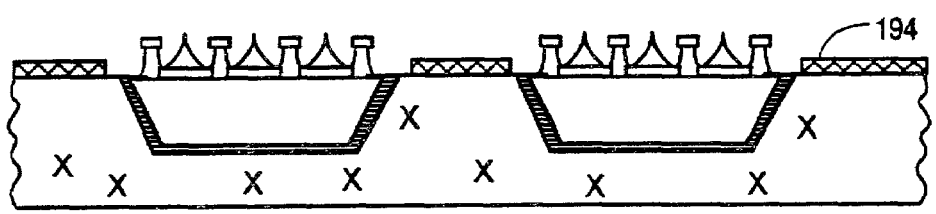
FIG. 26C illustrates deposition of planarization material and openings being created in the substrate in accordance with one embodiment of the invention.
Figure 26D:
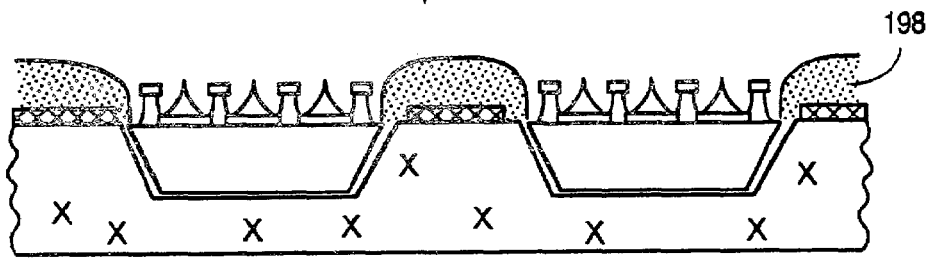
FIG. 26D illustrates another material placed over a portion of the blocks in accordance with one embodiment of the invention.

FIGS. 26A–26C illustrate generally the process of planarization material being added onto the substrate. FIG. 26A illustrates a planar side view of a substrate 190. FIG. 26B illustrates openings or receptor regions 192 created and blocks having emitters and gates deposited into the substrate. FIG. 26C illustrates deposition of planarization material 194 and openings being created into the substrate. FIG. 26D illustrates a second material 198 placed over a portion of the blocks with emitter and gates thereon.

Figure 27A:
FIGS. 27A–27G illustrate recessed regions created in a substrate and FSA being used to assemble structures onto the substrate.
Figure 27B:
Figure 27C:
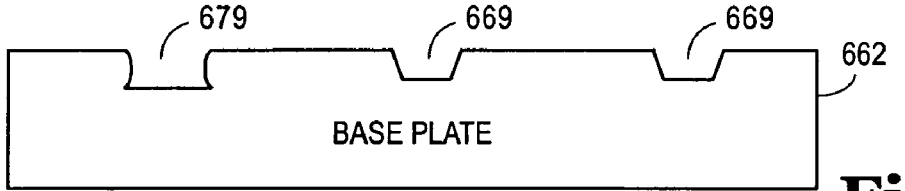
Figure 27D:
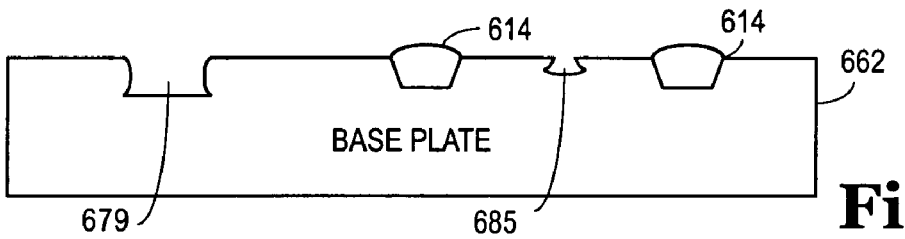

The formation of plasma displays by implementing techniques of the invention is described below relative to FIGS. 27–30F. FIGS. 27A–27G illustrate the assembly of rods onto a substrate. FIG. 27A illustrates a first substrate 662. The first substrate 662 is comprised of glass but other rigid material may be used. FIG. 27B illustrates a planar side view of recessed regions or apertures 669 created in first substrate 662. First substrate 662 has a plurality of recessed regions that are sized and shaped to receive rods 614. In this particular embodiment, a recessed region has a diameter slightly greater than the diameter of the object that it is established to receive. For example, rods 614 are sized and shaped slightly smaller than the recessed regions that are set to receive 685 them. FIG. 27D illustrates recessed regions 679 for spacers 668 and recessed regions 685 for barrier ribs 666 are created in the substrate and are slightly larger than the diameters of the objects that they are set to receive. These recessed regions may be created in a variety of methods such as that which is described in co-pending U.S. Pat. No. 6,281,038 entitled "Apparatuses and Methods for Forming Assemblies".

Figure 27E:
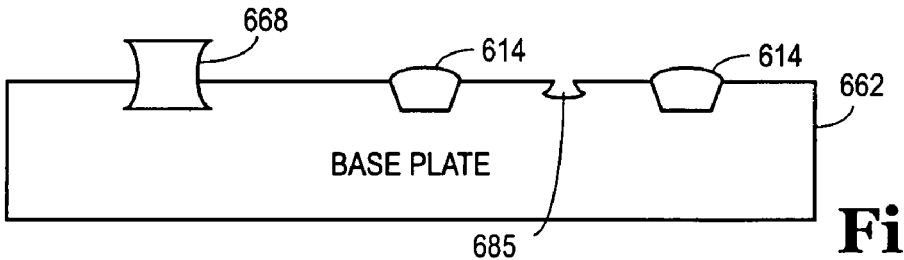
Figure 27F:
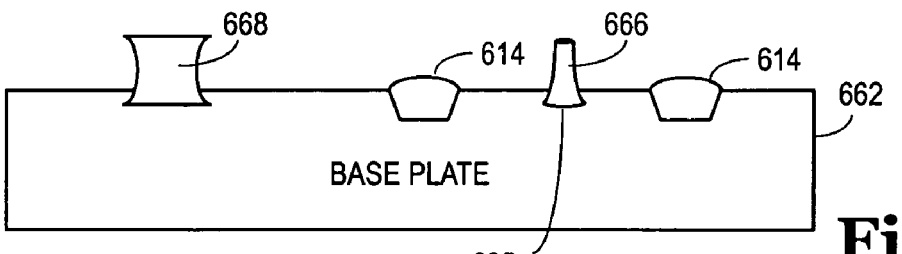

FIG. 27D illustrate a cross-sectional view of rods 614 deposited into their respective recessed regions 669. FIG. 27E illustrates spacer 668 placed into recessed region 679. FIG. 27F illustrates barrier rib 666 in recessed region 685.

Figure 27G:
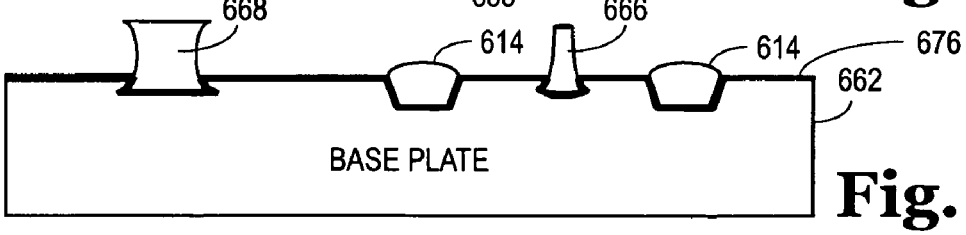

In one particular embodiment as shown in FIG. 27G, the first substrate 662 has a coating of conductive material such as aluminum. Gettering material 676 may be deposited onto first substrate 662. Gettering material 676 is used for the purpose of collecting gaseous contaminants within a display. These materials may include zirconium/vanadium iron alloy, zirconium metal, or materials having aluminum or titanium. These materials may be found in powdered form or may be liquefied and used to adhere with the first substrate 662. The gettering materials may have a low melting point alloy such as indium alloy. Gettering material also may be applied by electrophoretic deposition, screen printing, or other methods described below. First substrate 662 is connected to a direct current (DC) voltage source (not shown). This DC voltage source applies a suitable voltage up to at least 400 volts.

The first substrate 662 is conductive in order to bleed off impinging charge. In one particular embodiment, the first substrate 662 includes a glass substrate that has a coating of conductive material such as aluminum. Gettering material 676 for collecting gaseous contaminants within the display may also be deposited onto the glass substrate.

Spacers 668 are dispensed onto the rigid substrate. Spacers 668 separate the face plate and the base plate. Rods 614 are deposited onto the rigid substrate and are part of the active matrix display backplane. Rods 614 drive a picture element (not shown).

Figure 28:
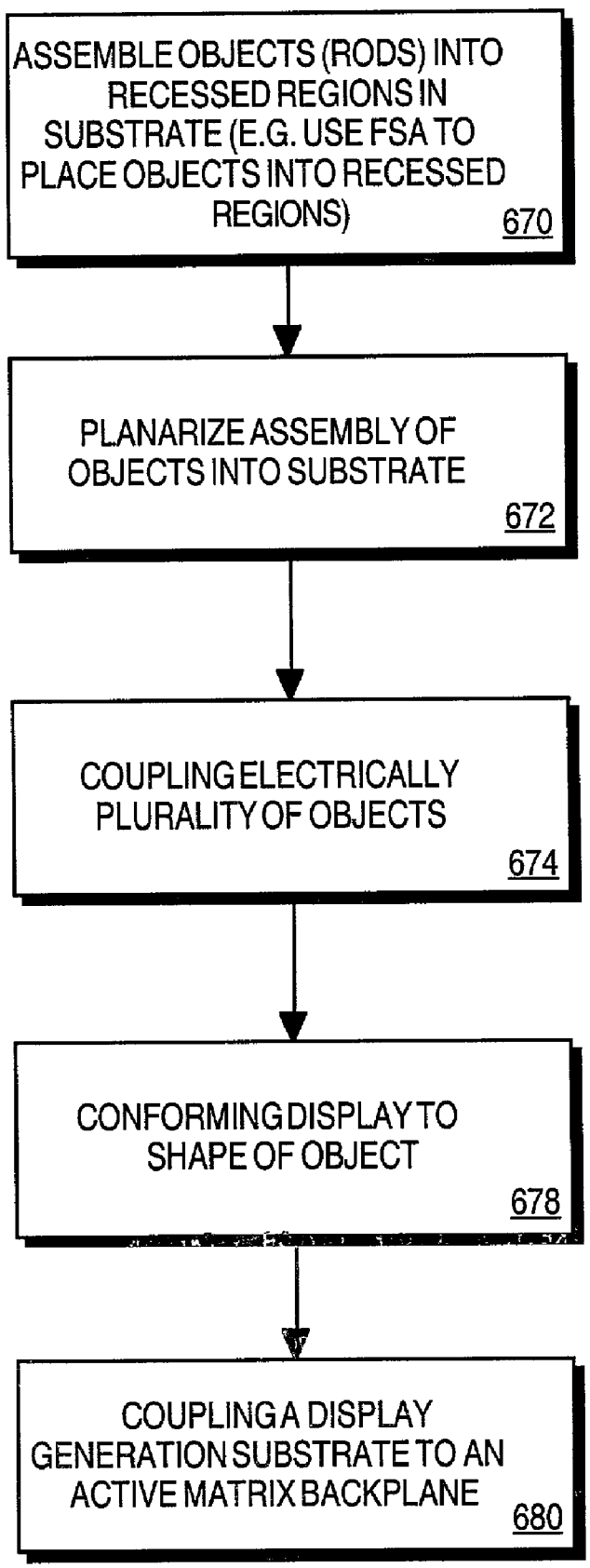
FIG. 28 illustrates a flow chart of the method of assembling a rigid display by depositing rods onto the rigid substrate.

FIG. 28 illustrates one method of assembling a rigid display along the length of a rigid substrate in accordance with an embodiment of the invention. Objects (e.g., rods) are assembled into the openings of the rigid substrate of operation 670. Utilizing an FSA process, a plurality of rods are deposited in a slurry that go into the recessed regions of the rigid substrate. A plurality of barrier ribs and spacers 668 are then deposited onto the rigid substrate.

Planarization of the assembly of objects into substrate is the next operation 672. Planarization takes place by a variety of methods such as depositing a material that may be spun to flatten certain objects that were dispensed onto the substrate or may be subjected to conventional chemical-mechanical polishing. Then, the electrical coupling of the plurality of rods 614 takes place at 674 by opening holes in the planarization layer and depositing metalization material or other conductive materials into the holes and beyond the holes to form an interconnect (e.g., a row or column interconnect). The display is made to conform the object's shape 678. A display generation substrate (e.g., plasma layer) is coupled to the active matrix backplane 680.

Figure 29:
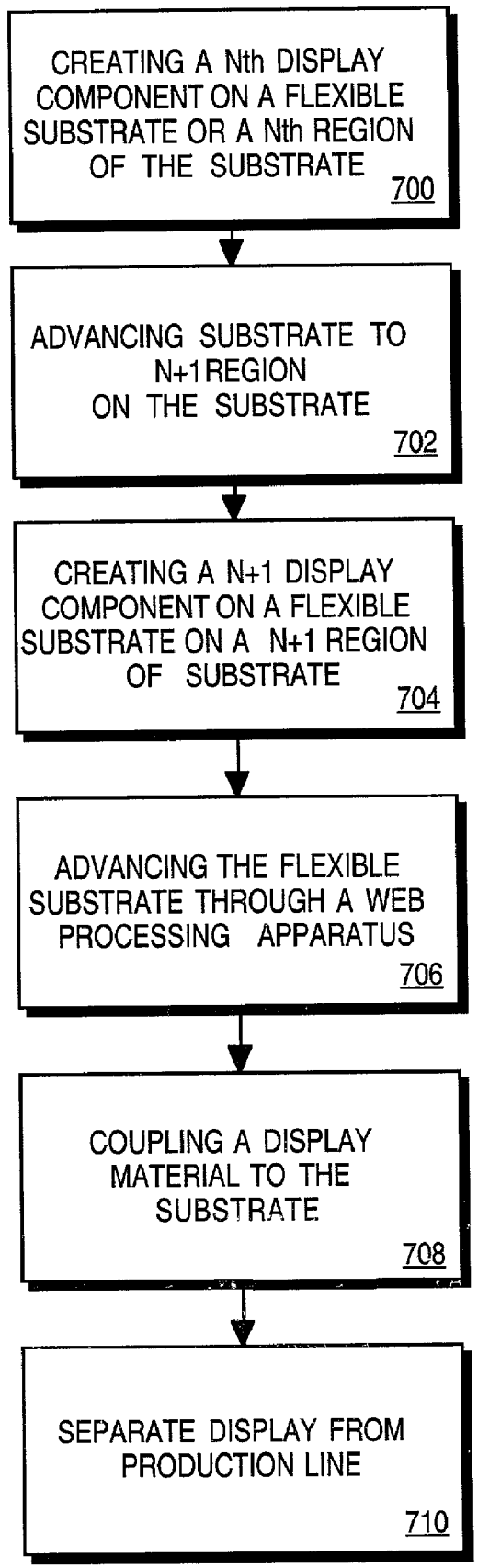
FIG. 29 illustrates a flowchart of the method of manufacturing multiple displays along a rigid substrate.

FIG. 29 illustrates a method of manufacturing multiple displays along a substrate. Multiple display components are created on a substrate at operation 700. The substrate is advanced to a second region on the substrate at operation 702. A new display component is created on the rigid substrate in a different region of the substrate at operation 704 by advancing the substrate through a web processing of apparatus at operation 706 and coupling a display material to the substrate at operation 708. Separation of the display panel occurs at the end of the process 710.

Figure 30A:
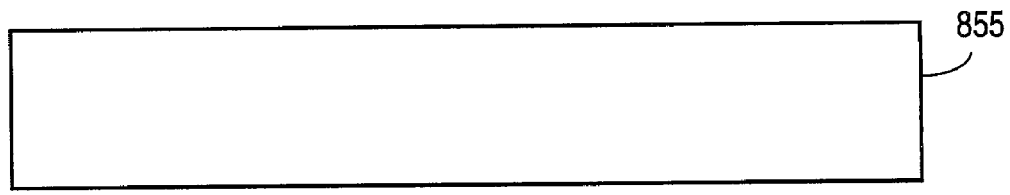
FIGS. 30A through 30F illustrate one embodiment of double template transfer of rods.
Figure 30B:
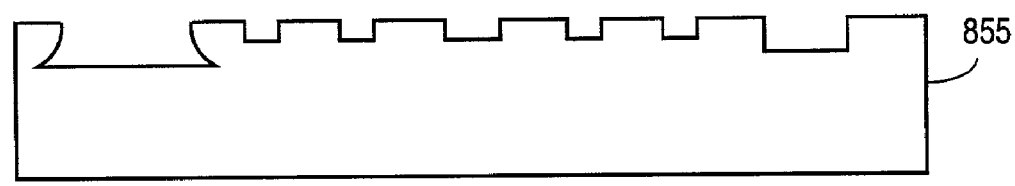
Figure 30C:
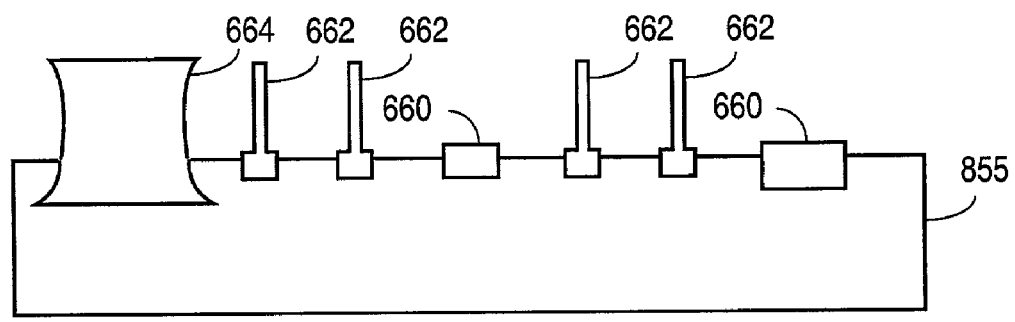

FIGS. 30A through 30E show planar side views as to how the transfer of rods with circuit elements thereon are transferred to substrates that are used to form displays or other assemblies. FIG. 30A illustrates a planar side view of a template (donor substrate) 855. FIG. 30B illustrates recessed regions in template 855. These recessed regions may be made by a variety of conventional methods and another method described in co-pending U.S. Pat. No. 6,555,408 entitled "Methods for Transferring Elements From A Template to a Substrate". FIG. 30C illustrates a first plurality of objects dispensed onto template 855. In this embodiment, rods 660, barrier ribs 662, and spacers 664 are dispensed onto template 855. It will be appreciated that these objects may be dispensed in several operations such as dispensing each type of object in one operation or a variety of objects may be dispensed onto template 855 in an operation. If the objects do not fill all of the recessed regions, a second plurality of objects may be dispensed onto template 855. Template 855 may be comprised of rigid material such as metal including steel, stainless steel, molybdenum, aluminum, invar, beryllium, copper, brass, and glasses such as quartz, soda lime, borosilicate or plastics such as polyimide, polyamide, ABS, PVC, acrylic, polycarbonate, nylon, and ryton. These templates are manufactured by a variety of methods such as injection molding or by using a press that makes impressions into a template base comprised of the materials listed above. FIG. 30C illustrates a planar side view of a template 855 in which rods 660 are seated in recessed regions. The rods may be kept in place by a variety of methods. In one case, the rods may be deposited by FSA onto the template and then secured by a release tape which is placed over the rods and the top surface of the template. Additionally, electrostatic forces or vacuum may be used to hold the rods in place.

Figure 30D:
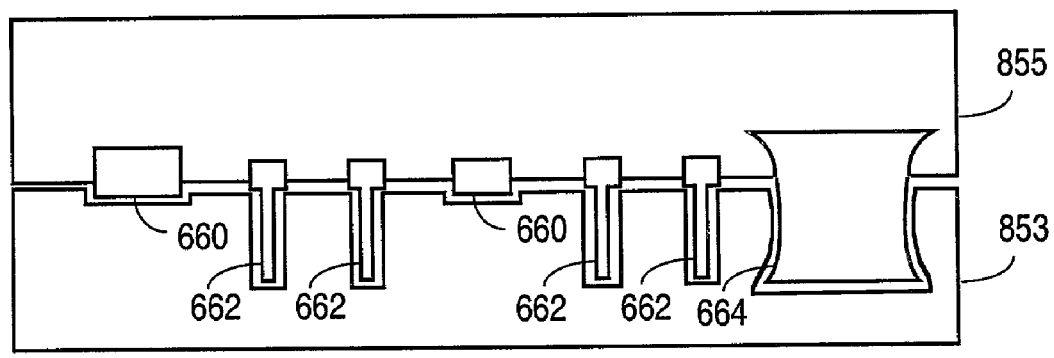
Figure 30E:
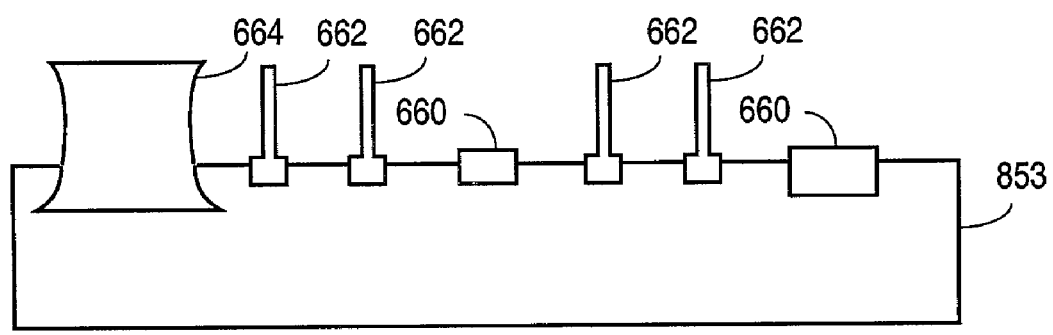
Figure 30F:
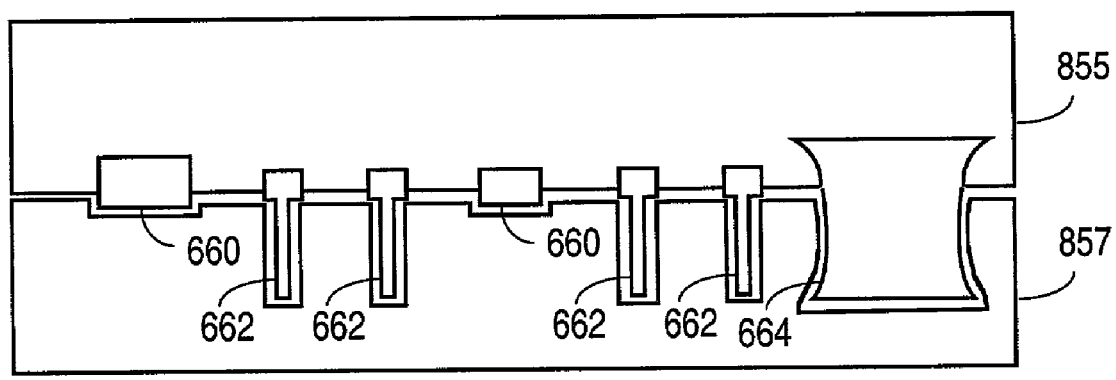

FIG. 30D illustrates a planar side view of a template 855 holding the rods. In this embodiment, the template 855 is inverted over a receiving substrate 853. However, the receiving substrate 853 may be placed over the template and pressed against the template 855. A variety of other positions may be used when transferring rods to a receiving substrate 853 but the important factor is that template 855 with the plurality of rods must contact at least one side of the receiving substrate 853. Contact of just the plurality of rods 660, barrier ribs 662, and spacers 664 may be sufficient to perform the transfer. The receiving substrate 853 may have recessed regions or holes or the rods in the template 855 and may create recessed regions or holes in the receiving substrate when the template contacts the receiving substrate 853. In an alternative embodiment, the rods are released from the template by using a material such as release tape. The release tape is heated causing the rods to be released from the template. The heat is applied through conventional sources such as convection. Another embodiment of the invention allows the rods to be released from the template by pressure. Pressure may be applied mechanically such as through a press. FIG. 30D illustrates a planar side view of the template 855 contacting the receiving flexible substrate 853. FIG. 30E illustrates the rods being transferred to the receiving substrate. FIG. 30F illustrates another embodiment of the end result of a planar side view of the template 855 after it is removed from the receiving rigid substrate 853 and the rods have been transferred. Here, the rods are inverted, showing that the rods may be transferred in which a portion of the rods is transferred to the receiving substrate 857.

While an array of components (e.g., display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

Listed below are related U.S. patent applications that describe various improvements to the methods and devices of the invention described herein. These patent applications and a U.S. patent are incorporated by reference.

Co-pending U.S. patent application Ser. No. 09/270,146, now abandoned, entitled "Apparatuses And Methods For Forming Assemblies", filed by Jeffrey J. Jacobsen, Glenn Wilhelm Gengel, and Gordon S. W. Craig and assigned to the same Assignee as the present invention, describes an electronic modular assembly. This co-pending application is hereby incorporated herein by reference.

Co-pending U.S. Pat. No. 6,5550.408 entitled "Methods For Transferring Elements From A Template To A Substrate", filed by Jeffrey J. Jacobsen, Mark A. Hadley, and John Stephen Smith and assigned to the same Assignee of the present invention, describes an FSA on a template with transfer to another substrate. This co-pending application is hereby incorporated herein by reference.

Co-pending U.S. Pat. No. 6,316,278 entitled "Methods and Apparatuses For Fabricating A Multiple Module Assembly", filed by Jeffrey J. Jacobsen, Glenn Wilhelm Gengel, and Gordon S. W. Craig and assigned to the same Assignee as the present invention, describes an electronic modular assembly. This co-pending application is hereby incorporated herein by reference.

Co-pending U.S. Pat. No. 6,274,508 entitled "Apparatuses And Methods Used In Forming Electronic Assemblies", filed by Jeffrey J. Jacobsen, Glenn Wilhelm Gengel, and John Stephen Smith and assigned to the same Assignee as the present invention, describes a method of molding substances. This co-pending application is hereby incorporated herein by reference.

Co-pending U.S. Pat. No. 6,468,638 entitled "Web Process Interconnect In Electronic Assemblies", filed by Jeffrey J. Jacobsen, Glenn Wilhelm Gengel, Mark A. Hadley, Gordon S. W. Craig, and John Stephen Smith and assigned to the same Assignee as the present invention, describes a method of creating various interconnects on a web tape. This co-pending application is hereby incorporated herein by reference.

Co-pending U.S. Pat. No. 6,281,038 entitled "Apparatuses And Methods For Forming Assemblies", filed by Jeffrey J. Jacobsen and assigned to the same Assignee as the present invention, describes a method of rolling objects into their recessed regions. This co-pending application is hereby incorporated herein by reference.

U.S. Pat. No. 5,545,291 entitled "Method For Fabricating Self-Assembling Microstructures," filed by John S. Smith and Hsi-Jen J. Yeh, issued Aug. 13, 1996, is hereby incorporated herein by reference.

In the foregoing detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A display device comprising:
   a first voltage driver; and
   an array of blocks having formed thereon display drivers, each of said blocks being formed from a first substrate and deposited and recessed onto a second substrate, each of said blocks having said display drivers converting a first voltage from said first voltage driver to a second voltage.

2. The display device of claim 1, wherein a plurality of spacers are deposited onto the second substrate.

3. The display device of claim 1, wherein a plurality of driver chips are deposited onto the second substrate.

4. The display device of claim 1, wherein said display device conforms to a desired shape of an object which is planar when said display device is attached to said object.

5. The display device of claim 1, wherein said display device conforms to a desired shape of an object which is non-planar when said display device is attached to said object.

6. The display device of claim 1, wherein at least one of blocks with the display drivers formed from the first substrate and deposited and recessed onto the second substrate drives a picture element.

7. The display device of claim 1, wherein the blocks with the display drivers are rods.

8. The display device of claim 1, wherein the display drivers are at least one emitter and at least one gate.

9. The display device of claim 1, wherein a first plurality of shaped blocks having drivers and a second plurality of shaped blocks having drivers are deposited on a substrate.

10. The display device of claim 1, wherein a plurality of objects are deposited onto the first substrate, the objects are one of display drivers, spacers, emitters, and gates.

11. A display device comprising:
a first voltage driver;
a plurality of first blocks having formed thereon display drivers, each of the first blocks converting a first voltage from the first voltage driver to a second voltage; and a
substrate with a plurality of recessed regions shaped to receive the plurality of first blocks,
wherein the plurality of first blocks are deposited in the plurality of recessed regions.

12. The display device of claim 11 further comprising a plurality of second blocks having formed thereon spacers, the plurality of second blocks being deposited in a plurality of recessed regions in the substrate shaped to receive the plurality of second blocks.

13. The display device of claim 11 further comprising a plurality of third blocks with driver chips, the plurality of third blocks being deposited in a plurality of recessed regions in the substrate shaped to received the plurality of third blocks.

14. The display device of claim 11 wherein the display drivers comprises at least one emitter and at least one gate.

15. The display device of claim 11 wherein the substrate is flexible.

16. The display device of claim 11 wherein the substrate is rigid.

* * * * *